(12) United States Patent
Wu et al.

(10) Patent No.: US 9,997,404 B2
(45) Date of Patent: *Jun. 12, 2018

(54) METHOD OF FORMING AN INTERCONNECT STRUCTURE FOR A SEMICONDUCTOR DEVICE

(71) Applicant: Taiwan Semiconductor Manufacturing Company, Ltd., Hsin-Chu (TW)

(72) Inventors: Yung-Hsu Wu, Taipei (TW); Cheng-Hsiung Tsai, Zhunan Township (TW); Yu-Sheng Chang, Taipei (TW); Chia-Tien Wu, Taichung (TW); Chung-Ju Lee, Hsinchu (TW); Yung-Sung Yen, New Taipei (TW); Chun-Kuang Chen, Guanxi Township (TW); Tien-I Bao, Dayuan Township (TW); Ru-Gun Liu, Zhubei (TW); Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/249,805

(22) Filed: Aug. 29, 2016

(65) Prior Publication Data
US 2016/0365276 A1    Dec. 15, 2016

Related U.S. Application Data

(63) Continuation of application No. 14/504,067, filed on Oct. 1, 2014, now Pat. No. 9,431,297.

(51) Int. Cl.
| H01L 21/4763 | (2006.01) |
| H01L 21/768 | (2006.01) |
| H01L 21/02 | (2006.01) |
| H01L 21/311 | (2006.01) |
| H01L 23/528 | (2006.01) |

(52) U.S. Cl.
CPC .... *H01L 21/76877* (2013.01); *H01L 21/0228* (2013.01); *H01L 21/02115* (2013.01); *H01L 21/02186* (2013.01); *H01L 21/31144* (2013.01); *H01L 21/76802* (2013.01); *H01L 21/76808* (2013.01); *H01L 21/76811* (2013.01); *H01L 23/5283* (2013.01); *H01L 21/76816* (2013.01); *H01L 2221/1063* (2013.01)

(58) Field of Classification Search
USPC .......................................... 438/624, 667, 618
See application file for complete search history.

(56) References Cited

U.S. PATENT DOCUMENTS 6,911,397 B2    6/2005    Jun et al.
8,518,824 B2    8/2013    Arnold et al.
(Continued)

*Primary Examiner* — Timor Karimy
(74) *Attorney, Agent, or Firm* — Haynes and Boone, LLP

(57) ABSTRACT

Methods of semiconductor device fabrication are provided including those that provide a substrate having a plurality of trenches disposed in a dielectric layer formed above the substrate. A spacer material layer is formed over the plurality of trenches. A via pattern including a plurality of openings is formed over the spacer material layer and plurality of trenches. Via holes can be etched in the dielectric layer using the via pattern and spacer material layer as a masking element.

20 Claims, 24 Drawing Sheets

(56) References Cited

U.S. PATENT DOCUMENTS

| | | | |
|---|---|---|---|
| 9,123,776 B2* | 9/2015 | Tsai | H01L 21/76802 |
| 2003/0199169 A1* | 10/2003 | Jun | H01L 21/76807 |
| | | | 438/694 |
| 2009/0098732 A1* | 4/2009 | Cho | H01L 21/76831 |
| | | | 438/675 |

* cited by examiner

US 9,997,404 B2

METHOD OF FORMING AN INTERCONNECT STRUCTURE FOR A SEMICONDUCTOR DEVICE

PRIORITY DATA

The present application is a Continuation of U.S. patent application Ser. No. 14/504,067, filed Oct. 1, 2014, entitled "METHOD OF FORMING AN INTERCONNECT STRUCTURE FOR A SEMICONDUCTOR DEVICE", hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. When a semiconductor device such as a metal-oxide semiconductor field effect transistors (MOSFET) is scaled down through these various technology nodes, interconnections of conductive lines and vias that facilitate the electrical connection between transistors (and other devices) have a critical role in IC performance improvement.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
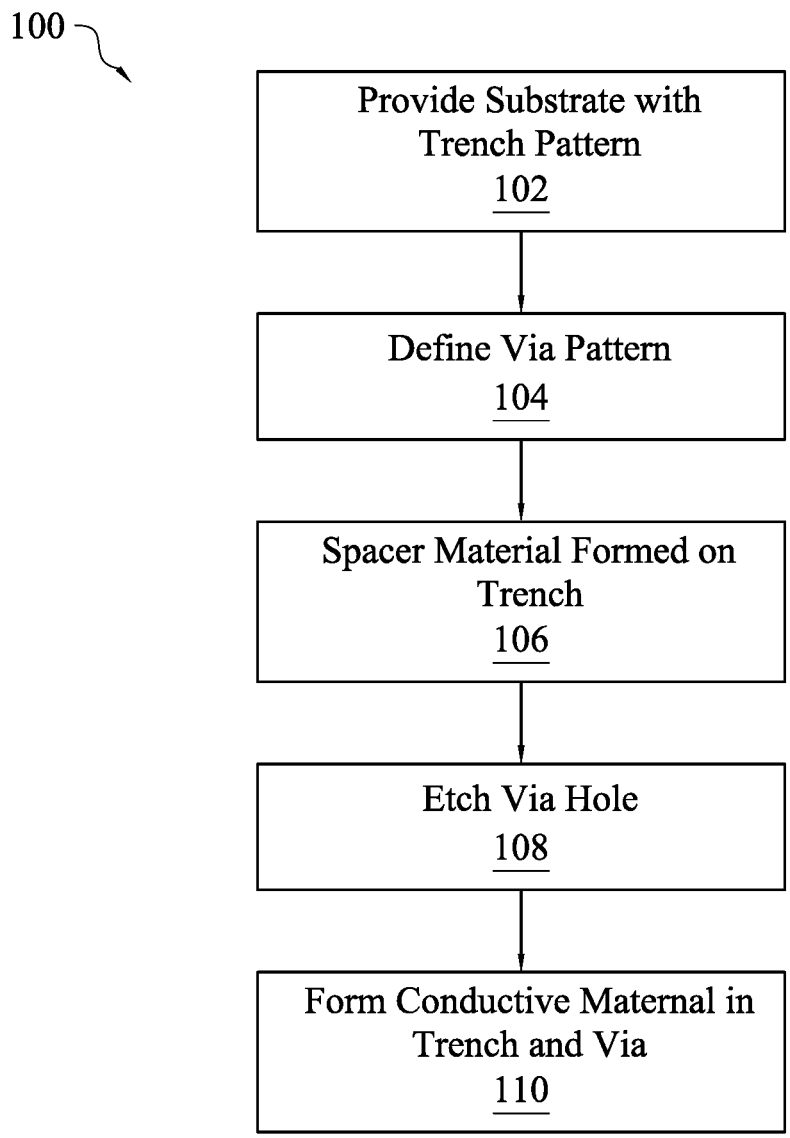
FIG. 1 is a flowchart of an embodiment of a method for fabricating a semiconductor device (e.g., IC) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
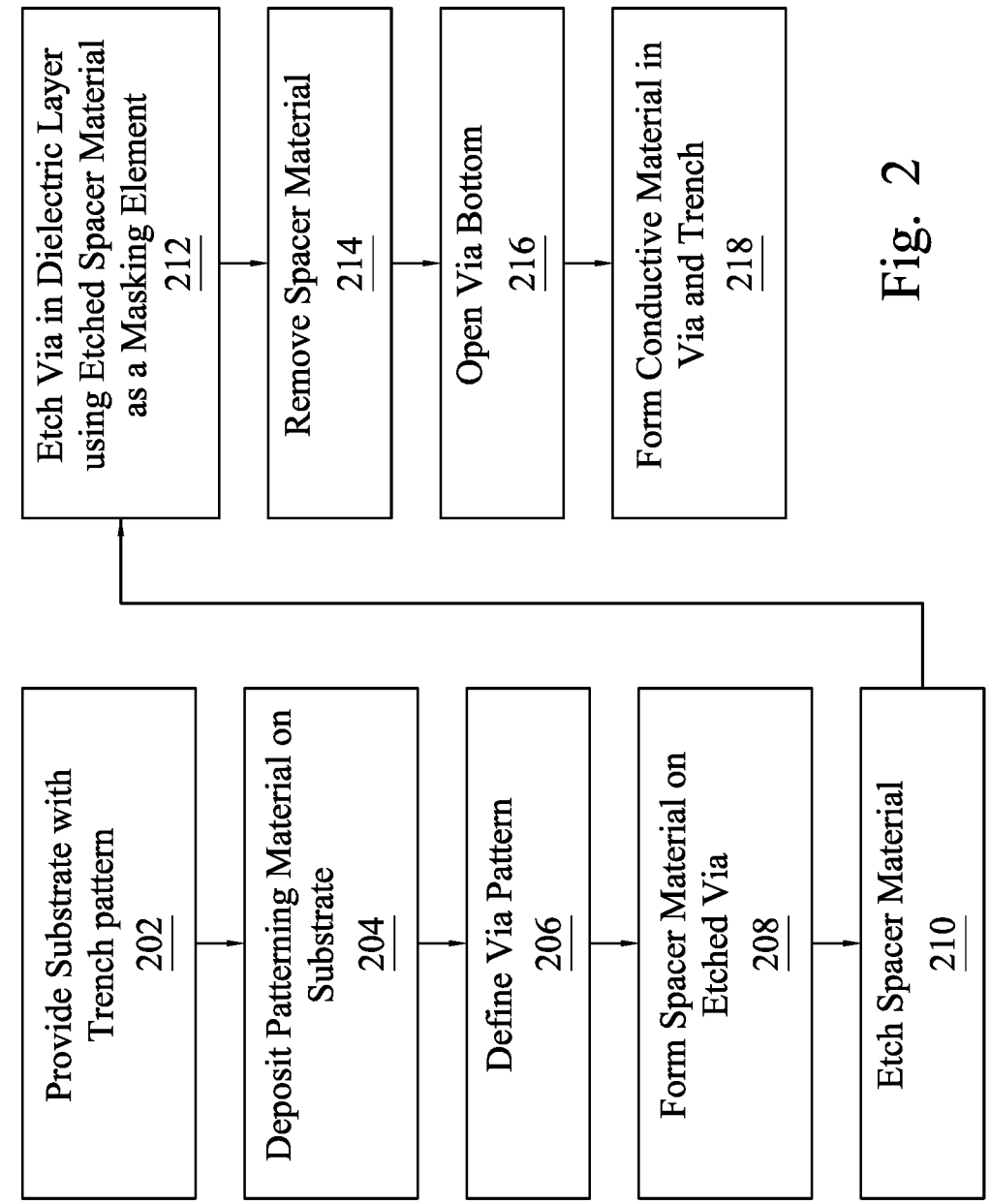
FIG. 2 is a flowchart of an embodiment of the method of FIG. 1, in accordance with some embodiments.
Figure 3:
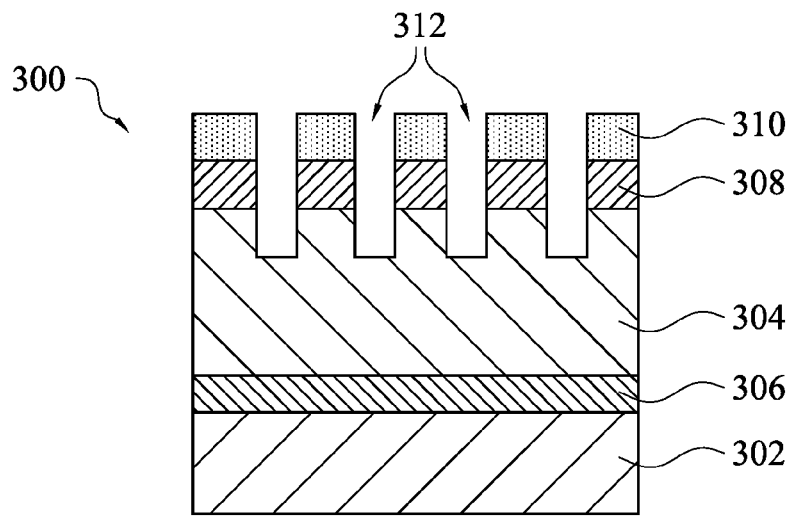
FIGS. 3-16 are cross-sectional views of an example of a semiconductor device according to various steps of the method of FIG. 2.
Figure 27:
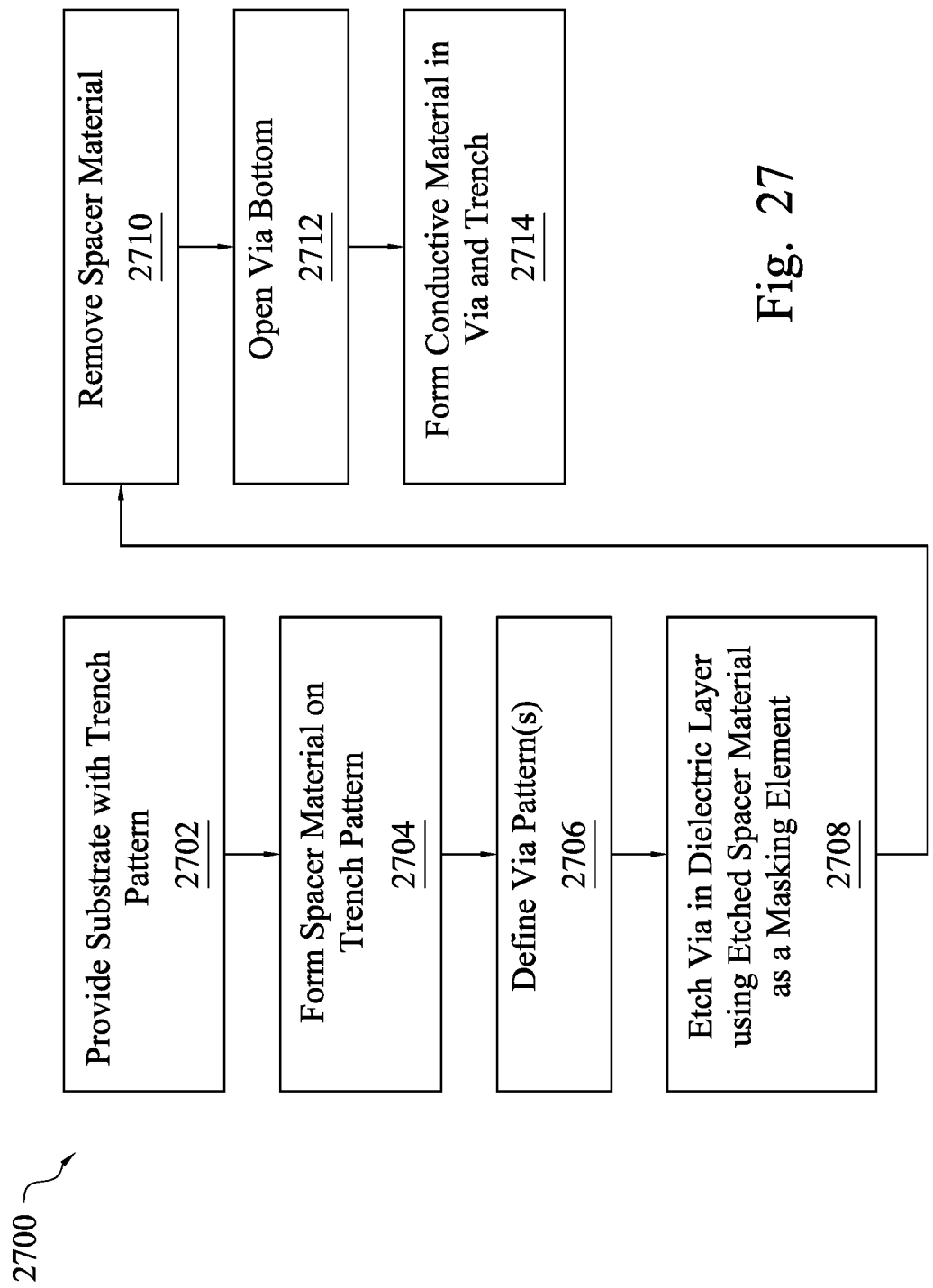
FIG. 27 is a flowchart of another example of the method of FIG. 1, in accordance with some embodiments.
Figure 28:
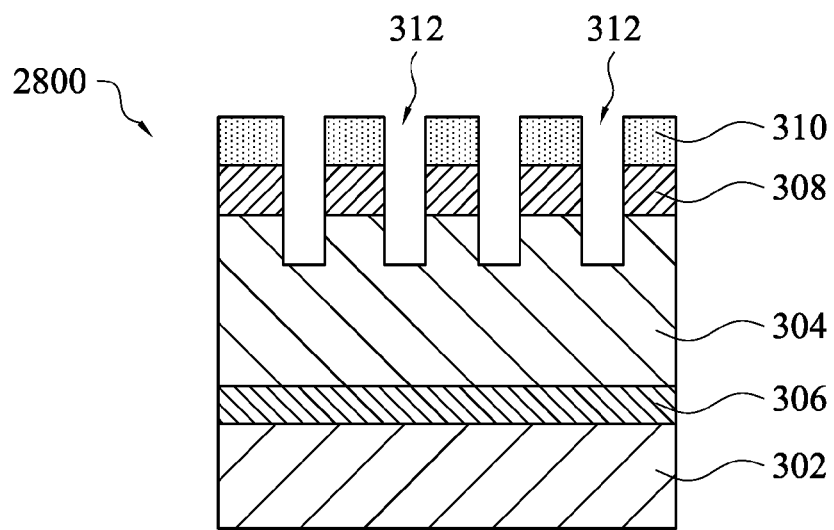
FIGS. 28-36 are cross-sectional views of an embodiment of a semiconductor device according to various steps of the method of FIG. 27.

Referring to FIG. 1, illustrated is a method 100 of fabricating one or more semiconductor devices according to aspects of the present disclosure. The method 100 is discussed briefly below, while the methods of FIGS. 2 and 27 provide further examples of the method 100. Thus, those descriptions of each of the methods of FIGS. 2 and 27 also apply to the method 100.

The method 100 begins at block 102 where a substrate is provided. The substrate includes a semiconductor substrate, such as a silicon wafer. Alternatively or additionally, the substrate may include other materials such as elementary semiconductors, e.g., germanium; compound semiconductors, e.g., silicon carbide, gallium arsenide, indium arsenide, indium phosphide; allow semiconductors, e.g., silicon germanium, silicon germanium carbide, gallium arsenic phosphide, gallium indium phosphide; and/or other suitable materials. In an embodiment, the substrate includes an epitaxial layer, for example, overlying a bulk semiconductor layer. In an embodiment, the substrate may include a semiconductor-on-insulator (SOI) structure.

The substrate may further include various features such as doped regions, implemented for example, by processes such as ion implantation, diffusion, and/or other suitable processes. These doped regions include n-wells, p-wells, source or drain regions (including, for example, low-dose regions (LDD)), doped channel regions, and the like. The substrate may further include isolation features such as shallow trench isolation (STI) features and/or other insulating materials. The substrate may also include gate structures or stacks formed by dielectric and/or conductive layers disposed on the substrate. In some embodiments, a gate structure include interfacial layers (IL), dielectric layers (e.g., high-k dielectric or other suitable gate dielectric), and electrode layers such as polysilicon or metal gate electrode layers and/or other suitable layers. The features may be configured to form various semiconductor devices such as, for example, complimentary metal-oxide-semiconductor field effect transistors (CMOSFET), image sensors, light emitting diodes, memory cells, resistors, capacitors, and/or other features.

The substrate may also include one more or inter-level dielectric (ILD) layers. The ILD layers include a dielectric material layer such as silicon oxide, silicon nitride, a dielectric material having a dielectric constant (k) lower than thermal silicon oxide (referred to as a low-k dielectric material), and/or other suitable dielectric materials. The ILD layers may be formed using a suitable process such as spin-on deposition, chemical vapor deposition (CVD), and/or other processes. As used herein the ILD layers include the dielectric material used to separate metal layers as well as vias of a multi-layer interconnect (MLI), as discussed below.

The substrate may also include one more conductive features (e.g., lines or vias) formed thereon. The conductive features may form a portion of an interconnect structure referred to as a multi-layer interconnect (MLI) typically including a plurality of conductive layers (referred to as metal layers), contacts, and/or vias providing an interconnection of the conductive layers and/or other conductive features. As used herein the term "via" may include a contact feature. Depending on the layer level, the vias may provide connection to the conductive lines (wiring), connection between conductive lines (metal wiring), connection to doped regions, connection to a gate of transistor, connection to a plate of capacitor, and/or connection to other features of a semiconductor device or integrated circuit. The conductive features of the MLI may include barrier or liner layers. In an embodiment, the conductive features include aluminum (Al), copper (Cu), tungsten (W), respective alloys, combinations thereof, and/or other suitable conductive material. The conductive features may also include silicide features, for example, disposed on source, drain, or gate structures of a semiconductor device. In an embodiment, the ILD layer interposes the conductive features to provide suitable isolation.

The method 100 may be used to form a portion of the MLI structure discussed above. In other words, the conductive lines and vias (which include contacts) of an MLI may be formed using one or more of the steps of the method 100.

The substrate provided in block 102 includes a pattern of a plurality of trenches disposed, for example, in a dielectric layer such as an ILD layer. The pattern may provide a trench that defines the routing of a conductive feature such as a metal layer or line of an interconnect structure (or MLI). The trenches may be formed using suitable lithography and etching techniques. For example, a photosensitive material (photoresist) is disposed over one or more layers of dielectric material on the substrate. A masking step is performed to selectively remove the photoresist from certain regions to define the wiring paths. An etch process, using the masking element formed of the photoresist, etches away portions of a dielectric layer thereby forming trenches. As discussed below, a subsequent metal deposition process fills these trenches to form the conductive interconnect layers.

After formation of the trenches that will form the conductive interconnect layers (e.g., metal line such as metal-1, metal-2, etc.), a via pattern is formed over the substrate in block 104. The via pattern may be formed in one or more layers disposed over the substrate and disposed over the trenches. The via pattern may be defined by various layers including, for example, photosensitive layers and hard mask layers. The via pattern may be associated with (define) the layer of vias that will be formed underlying the conductive interconnect layer defined by the trench pattern of block 102. In other words, in an embodiment the trenches provide $M_{x+1}$ while the via pattern defines the $V_x$. The via pattern may be used to form a via ($V_x$) self-aligned with the trenches ($M_{x+1}$) as discussed below. Exemplary via patterns include those described in block 206 of the method 200 of FIG. 2 and/or the block 2706 of the method 2700 of FIG. 27, below. Block 104 may occur prior to or after block 106.

The method 100 then proceeds to block 106 where spacer material is formed on the sidewalls of the trench. In some embodiments, a conformal layer of spacer material is deposited and subsequently etched to remove the spacer material from portions of the trench (e.g., a bottom surface where a via hole will be formed). Various examples are provided below with reference to block 210 and block 2706 of the method 200 and 2700 respectively. The spacer material composition may be selected such that it provides an etch selectivity with respect to a dielectric layer (e.g., low-k dielectric) within which the trench and/or via is to be formed. Example spacer materials include titanium oxide (TiO), titanium nitride (TiN), amorphous-carbon (a-C), combinations thereof, and/or other suitable materials. The spacer material is formed, for example, by atomic layer deposition (ALD) or physical vapor deposition (PVD). The spacer material thickness may be specifically selected such that it compensates from misalignment of the via pattern with respect to the trenches. The spacer material may be formed on the trenches before or after the via pattern is defined. In some embodiments, the spacer material is only formed on the regions of the trenches unmasked or unprotected by the via pattern.

The method 100 then proceeds to block 108 where a via hole is etched. The via hole is etched using the via pattern and the spacers material as masking elements. A masking element is a feature that masks or protects regions underlying it from further processing such as etching or implantation. In an embodiment, the critical dimension (e.g., width) of the via hole is defined by the distance between the spacer elements disposed on the sidewalls of the via pattern. The via hole may be etched in a dielectric layer. In an embodiment, the via hole is etched in the dielectric layer including the trench pattern, for example, etching the via hole extending below the trench pattern.

In this or subsequent etches the via hole may be provided such that the via hole extends through the dielectric layer (or layers) and lands on the conductive contact underneath (e.g., gate feature, silicide feature, capacitor plate, another conductive wiring line, and/or other feature).

As illustrated in the description of the block 102 and the blocks that follow, the method 100 includes using a trench-first sequence where a trench (corresponding to the wiring path) is etched into a dielectric first. This is followed by the via hole being etched to intersect the first trench at the desired location of the via hole. In one embodiment, the trenches and holes are perpendicular to each other. However, other embodiments of the method 100 including forming the via prior to the trench.

The method 100 then proceeds to block 110 where a conductive material is formed in the trench and/or via hole. The conductive material may include aluminum (Al), copper (Cu), tungsten (W), respective alloys, combinations thereof, and/or other suitable conductive material. The conductive material deposited may also include a barrier or liner layer. The conductive material(s) may be formed by atomic layer deposition, plating, physical vapor deposition, and/or other suitable processes. In an embodiment, the formed conductive feature including via and trench forms a portion of a MLI of the integrated circuit fabricated on the substrate.

Before referring to the method 200 of FIG. 2, which is illustrative of one embodiment of the method 100 of FIG. 1, the following is noted. References in the present specification to one embodiment, an embodiment, example, and the like indicate that the embodiment described may include a particular feature, structure, block, or characteristic, but every embodiment may not necessarily include that particular feature, structure, block or characteristic.

Referring now to FIG. 2, illustrated is a method 200 of fabricating a interconnect structure for a semiconductor device. The method 200 may be one exemplary embodiment of the method 100, described above with reference to FIG. 1. FIGS. 3-16 are exemplary embodiments of a semiconductor device 300 according to one or more steps of the method 200.

The method 200 begins at block 202 where a substrate having a trench pattern is provided. Block 202 may be substantially similar to block 102 of the method 100, described above with reference to FIG. 1. Referring to the example of FIG. 3, a substrate 302 is provided. The substrate 302 includes a semiconductor substrate, such as silicon, germanium, silicon carbide, gallium arsenide, indium arsenide, indium phosphide, silicon germanium, silicon germanium carbide, gallium arsenic phosphide, gallium indium phosphide; and/or other suitable materials. The substrate 302 may further include various features such as doped regions, implemented for example, by processes such as ion implantation, diffusion, and/or other suitable processes. These doped regions include n-wells, p-wells, source or drain regions (including, for example, low-dose regions (LDD)), doped channel regions, and the like. The substrate 302 may also include gate structures or stacks formed by dielectric and/or conductive layers disposed on the substrate. The substrate 302 may also include features of an MLI structure. One or more of these features may be configured to form various semiconductor devices such as, for example, complimentary metal-oxide-semiconductor field effect transistors (CMOSFET), image sensors, light emitting diodes, memory cells, resistors, capacitors, and/or other features. In an embodiment, one or more of these features may include a conductive contact surface to which a via will be formed.

In the device 300, over the substrate 302 is a dielectric layer 304. In an embodiment, the dielectric layer 304 includes a low-k dielectric material. Exemplary compositions of the dielectric layer 304 include, but are not limited to, silicon oxide, doped silicon oxide, such as fluorinated silicon oxide (FSG), undoped or doped silicate glasses, such as boron phosphate silicate glass (BPSG), phosphate silicate glass (PSG), undoped or doped thermally grown silicon oxide, undoped or doped TEOS deposited silicon oxide, organo-silicate glass, porous low-k materials, and/or other suitable dielectric materials. The dielectric layer 304 may be referred to as an ILD layer. The dielectric layer 304 may be formed using a suitable process such as spin-on deposition, chemical vapor deposition (CVD), oxidation, and/or other processes. The dielectric layer 304 is the target layer for the formation of via(s) using the method 200.

An etch stop layer 306 interposes the substrate 302 and the dielectric layer 302. In other embodiments, the etch stop layer 306 is omitted. The etch stop layer 306 may include any suitable material included dielectric materials such as silicon nitride. In an embodiment, the etch stop layer 306 is a contact etch stop layer (CESL).

A first hard mask layer 308 is disposed on the dielectric layer 304. The first hard mask layer 308 is a dielectric hard mask such as tetraethyl orthosilicate (TEOS), other oxides, and/or other suitable hard mask materials. A second hard mask layer 310 is disposed on the first hard mask layer 308. The second hard mask layer 310 may be a metal-containing hard mask layer. Exemplary compositions for the second hard mask layer 310 include titanium nitride (TiN) and titanium oxide (TiO). Other exemplary hard masks for layer 308 and/or 310 may include silicon dioxide, silicon carbide, and/or other suitable materials. The hard mask layers 308 and/or 310 may be formed by suitable processes such as physical vapor deposition (PVD), atomic layer deposition (ALD), chemical vapor deposition (CVD), and/or other processes. In an embodiment, any number of hard mask layers may be present including a single layer. The first hard mask layer 308 and/or the second hard mask layer 310 may be used as a masking element when etching pattern of trenches 312 in the dielectric layer 304. For example, the hard mask layers 308 and/or 310 may be patterned using suitable photolithography and etch processes.

The trenches 312 may provide pattern defining the routing of a conductive feature such as a metal layer or line of an interconnect structure for the device 300 that is to be formed within the trench. For example, the trench 312 may define the routing of a metal layer such as, metal-1, metal-2, etc. The trench 312 may be substantially similar to as discussed above with reference to block 102.

The method 200 then proceeds to block 204 where patterning material(s) are formed on the substrate. In an embodiment, the patterning material(s) include at least one layer of photosensitive material that is capable of being patterned. The patterning material(s) may include, for example, a multi-layer photoresist, such as a tri-layer resist. The patterning material(s) may further include hard mask layers. Other materials including those later developed may be used for patterning.

Figure 4:
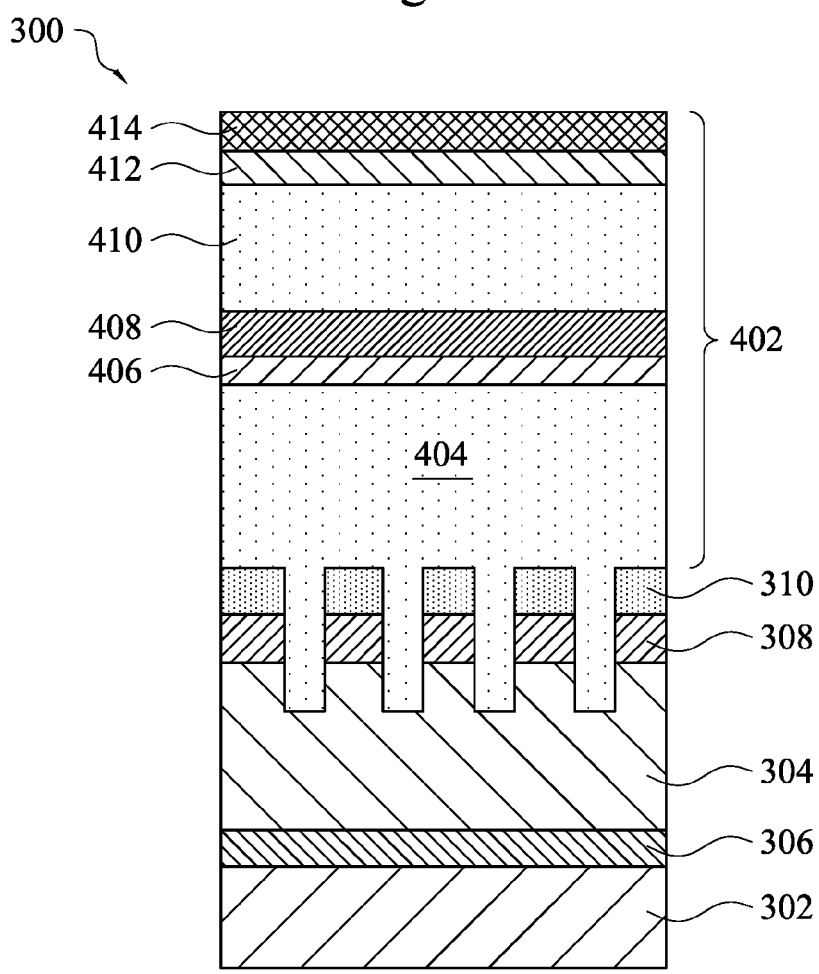

Referring to the example of FIG. 4, a plurality of patterning materials 402 are formed on the substrate 302. The stack of patterning materials 402 is exemplary only and not intended to be limiting except as specifically and explicitly stated in the claims that follow. The patterning materials 402 include a first bottom layer 404, a hard mask layer 406, a hard mask layer 408, a second bottom layer 410, a middle layer 412, and a photosensitive layer 414. The first and/or second bottom layers 404/410 may include a polymer such as $CH_xO_y$, where x and y are greater than 0. In an embodiment, the middle layer 412 includes a polymer such as $SiC_x$ polymer, where x is greater than 0. Other compositions of photolithography materials, including other compositions of tri-layer resists, anti-reflective coatings, and the like are possible. One or more of the layers 404, 410, 412, 414 may be formed by suitable processes such as spin on deposition.

As illustrated in FIG. 4, two hard mask layers are provided in the stack of patterning materials 402. The hard mask layers 406 and 408 may provide for defining the via pattern in one or more steps including as discussed herein. The hard mask layer 406 may be a metal-containing hard mask; the hard mask layer 408 may be a dielectric hard mask. In an embodiment, the hard mask layer 406 includes Titanium Oxide (TiO). In another embodiment, the hard mask layer 406 includes Titanium Nitride (TiN). The hard mask layer 406 may be formed by deposition processes such as, for example, atomic layer deposition (ALD), physical vapor deposition (PVD), or other suitable processes. In an embodiment, that hard mask layer 406 is TiO formed by ALD. In an embodiment, the hard mask layer 406 is TiN formed by PVD. The hard mask layer 406 may have a thickness between approximately 100 Angstroms and approximately 500 Angstroms. The deposition temperature of the hard mask layer 406 may be between approximately 100 degrees Celsius and approximately 250 degrees Celsius, by way of example. In an embodiment, the hard mask layer 408 is silicon oxide (e.g., SiOx, where x is greater than 0). The hard mask layer 408 may be, for example, SiOx, formed by ALD. The hard mask layer 408 may have a thickness between approximately 50 Angstroms and approximately 200 Angstroms. The deposition temperature of the hard mask layer 408 may be between approximately 50 degrees Celsius and approximately 250 degrees Celsius, by way of example.

The method 200 then proceeds to block 206 where a via pattern is defined. The via pattern may be defined using the patterning material(s) of block 204. The via pattern may be associated with the layer/level of vias (e.g., $V_x$) that will be formed underlying the conductive interconnect layer defined by the trenches ($M_{x+1}$) described above in block 202. In an embodiment, the via pattern defines the contact pattern providing interconnection to, for example, gate structures, source features, drain features, capacitors, etc. In an embodiment, the via pattern defines the via pattern providing interconnection between layers of a multi-layer interconnect (MLI) structure. The via pattern may be defined in multiple steps (e.g., with multiple exposures of photosensitive material(s)). The multiple steps (photo/etch) may provide for a reduced spacing (e.g., pitch) between contact features. In other embodiments, the via pattern may be formed in a single lithography/etch sequence.

Figure 5:
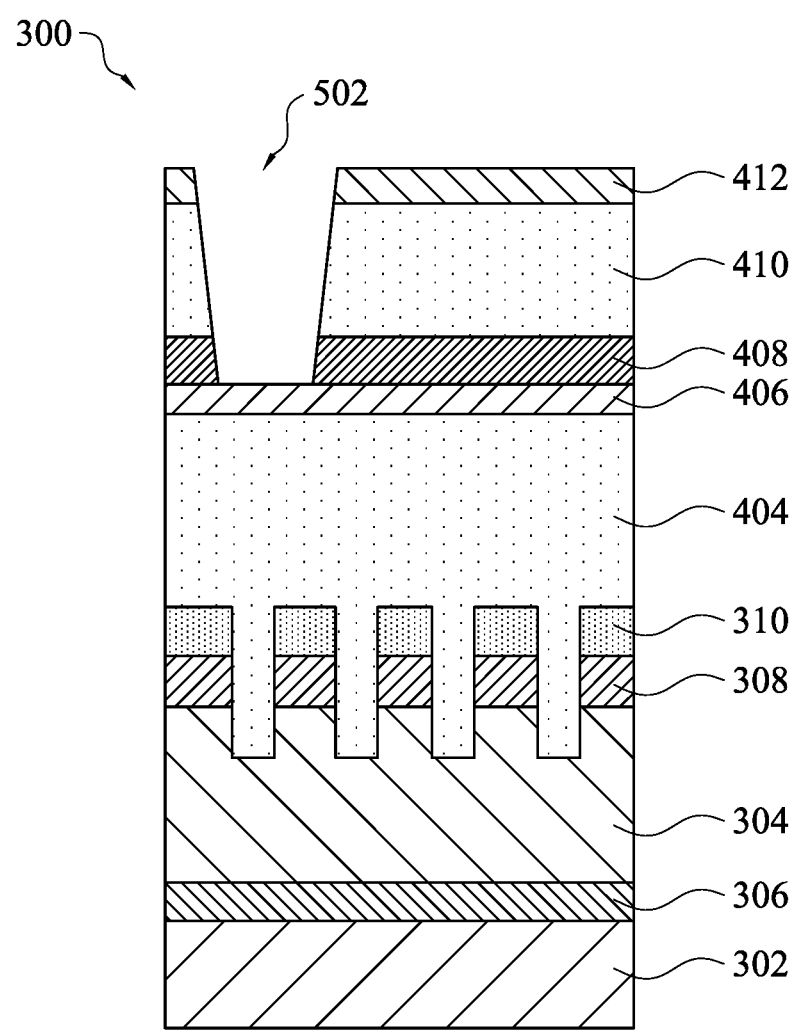
Figure 6:
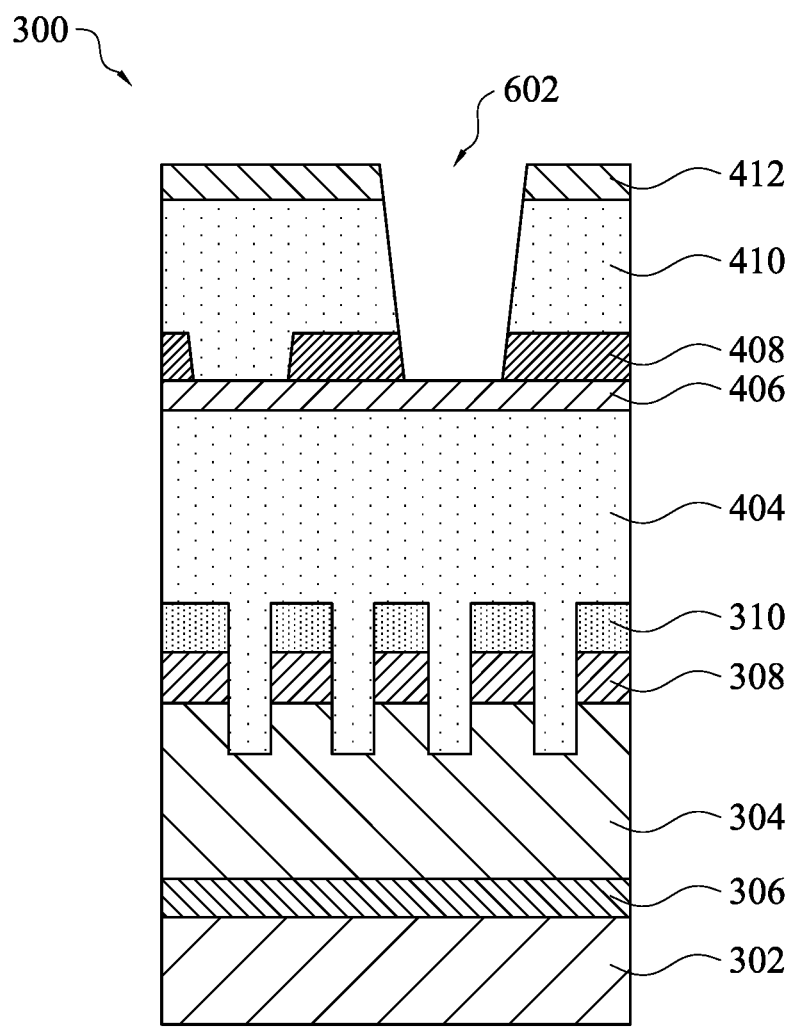
Figure 7:
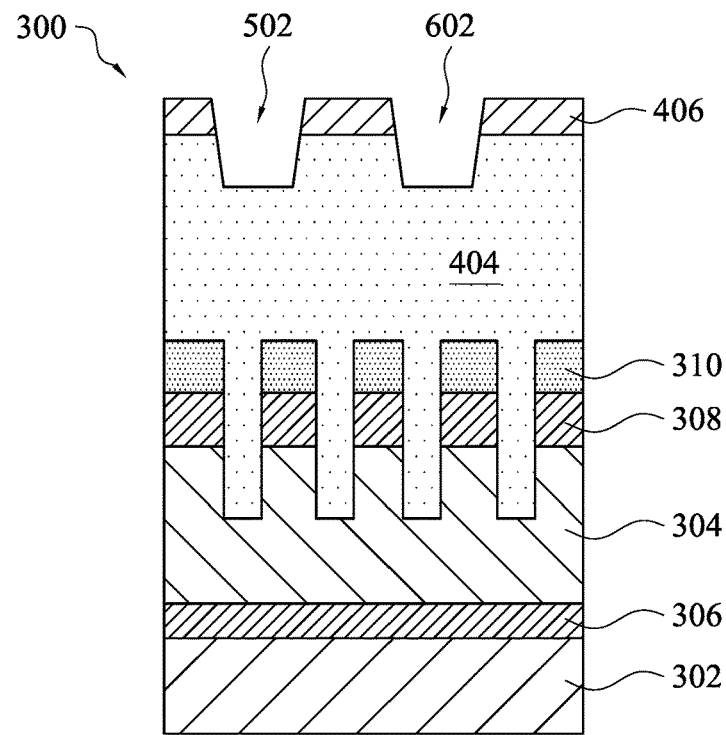

Referring to the example of FIG. 5, a first portion for of the via pattern is illustrated. The first portion includes an opening 502 in one or more of the patterning materials 402. Specifically, the opening 502 is defined in hard mask layer 408. The photoresist 414 may patterned to define the opening 502 and the photoresist 414 subsequently removed from the substrate 302. Referring next to the example of FIG. 6, a second portion for of the via pattern is illustrated. The second portion includes another opening 602 in at least one layer of the patterning materials 402. Specifically, the opening 602 is also defined in hard mask layer 408. A photoresist material may be formed on the device of FIG. 5, patterned to define the opening 602 and subsequently removed from the substrate 302. In other words, opening 602 may be formed by separate photolithography/etch steps from that of opening 502.

Block 206 continues to provide the via pattern to be defined in one or more underlying layers. Referring to the example of FIG. 7, the pattern defined by opening 502 and 602 is transferred to hard mask layer 406. The defining of the via pattern in layer 406 may be performed using a plasma etch or other suitable process. As illustrated, the bottom layer 404 is also etched, however other embodiments are possible depending on the etch selectivity.

Figure 38A:
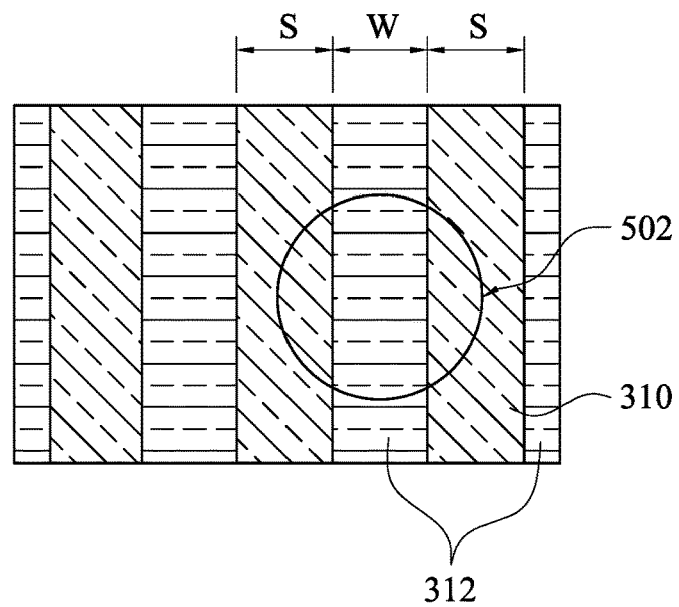
FIGS. 38a and 38c are top views of embodiments of a via pattern overlaying a trench pattern according to one or more aspects of the present disclosure.
Figure 38B:
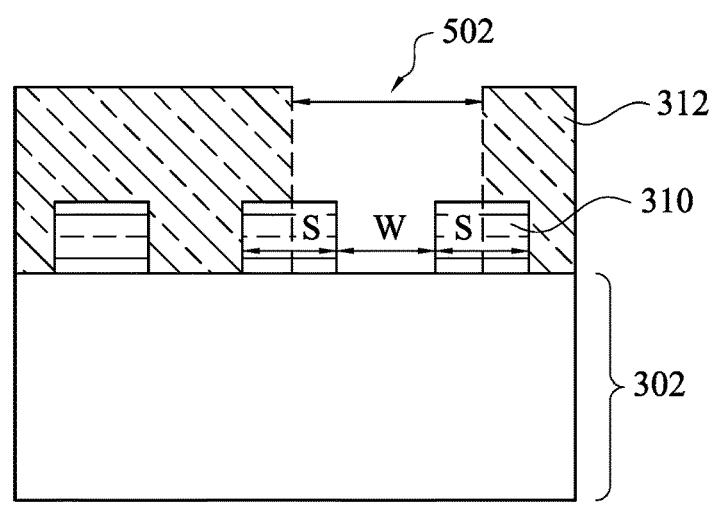
FIGS. 38b and 38d are cross-sectional views of embodiments of a via pattern on a trench pattern according to one or more aspects of the present disclosure.
Figure 38C:
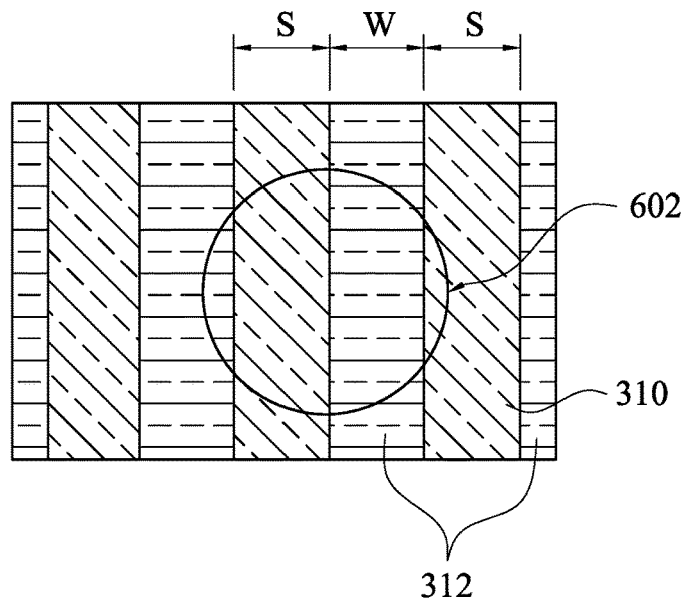

Block 206 further continues to etch underlying layer(s) using the via pattern such that the via pattern forms opening exposing portions of the trenches. Referring to the example of FIG. 8, the via pattern 502 and 602 are etched into the layer 404, hard mask 310 and hard mask 306. The via pattern 502 and 602 provide openings that are disposed above and connected to the trench pattern 312. FIGS. 38a and 38c are illustrative of a top view for ease of understanding.

Figure 8:
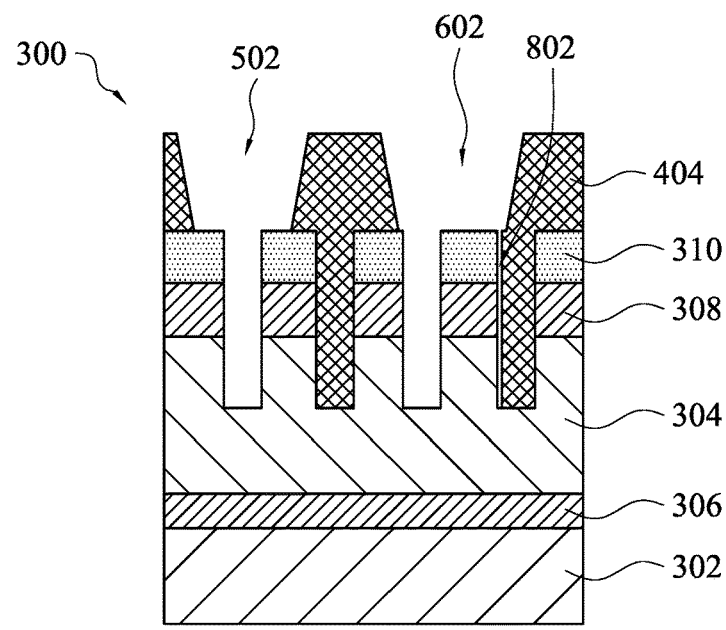

As illustrated in FIG. 8, the via pattern evidenced by opening 602 is slightly misaligned with reference to the trench it is targeted to connect (or land upon). Because of this misalignment, the via pattern opens regions 802 on adjacent trench portions that are not desired. This misalignment is also referred to herein as a mislanding. In other words, the region 802 is a portion of a misaligned or mislanded via pattern (e.g., not interfacing on the desired metal line). The region 802 forms a gap between the trench sidewall and the patterning layer 404.

Should etching of the via holes using the misaligned/ mislanded via pattern continue, a via hole will be formed that contacts an undesired metal line (the metal line formed in the trench that includes region 802. This can lead to performance issues such as shorting, increased leakage, Rc (circuit resistance) yield loss, and/or other performance issues. Thus, it is desired to provide a remedy for misalignment/mislanding of via patterns with respect to other features.

However, control of the misalignment may be difficult. For example, for a given lithography process to be used in the method 200 may have a clearance window of a specified amount. For example, in a 193 nm immersion lithography process the clearance window may be approximately 9.6 nm. When the spacing between conductive lines, e.g., between the trenches 312, is less than twice the clearance window, a misaligned or mislanded via may occur. This is discussed in further detail below with reference to FIG. 37.

Thus, the method 200 proceeds to block 208 where spacer material layer is formed on the via pattern defined by block 206. The thickness of the spacer material may be determined such that it is sufficient to fill any region (or gap) provided by the misalignment of the via pattern. Exemplary thicknesses of the spacer material layer include those between approximately 2 and approximately 5 nanometers. As discussed with reference to FIG. 37 below, the selection of the thickness of the spacer material layer should be such that twice the thickness will fill a maximum distance of misalignment that may occur.

The spacer material may have compositions including, for example, TiO, TiN or other suitable material having a sufficient etch selectivity ratio. In an embodiment, the spacer material layer is formed by atomic layer deposition (ALD). The spacer material layer may be formed using a process temperature of between approximately 100 and approximately 250 degrees Celsius. The process temperature may be selected such that it prevents any collapse of surrounding layers (e.g., bottom layer 404), prevents outgassing, and/or other process considerations. The process pressure may be between approximately 0.1 and approximate 10 torr. The process pressure may be selected such that it prevents any collapse of surrounding layers (e.g., bottom layer 404), prevents outgassing, and/or other process considerations.

Figure 9:
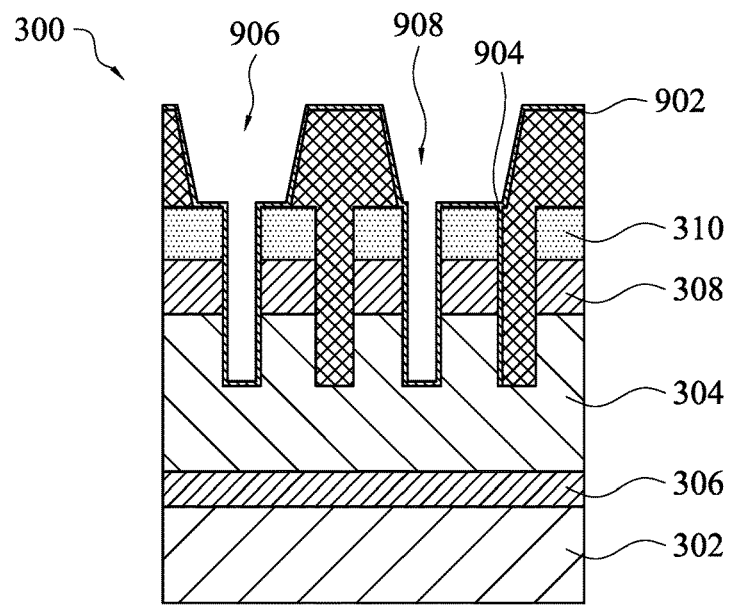

Referring to the example of FIG. 9, a spacer material layer 902 is formed over the substrate 302. The spacer material layer 902 may be a conformal layer. The spacer material layer 902 fills the region or gap 802 caused by the misalignment thereby forming merged region 904. The merged region 904 may prevent unwanted etching during the formation of the via hole using the via pattern (openings 502, 602). Upon the deposition of the spacer material layer 902, the previous pattern providing openings 502 and 602 is also re-defined to form openings 906 and 908 respectively. The opening 906 has a reduced critical dimension (e.g., width) from that of opening 502. The reduction in the critical dimension is approximately equal to two times the thickness of the spacer material layer 902. The opening 908 has a reduced critical dimension from that of opening 602. The reduction in the critical dimension is approximately equal to two times the thickness of the spacer material layer 902. It is also again noted that the opening 908 no longer provides a misaligned or mislanded portion (e.g., 802).

Figure 10:
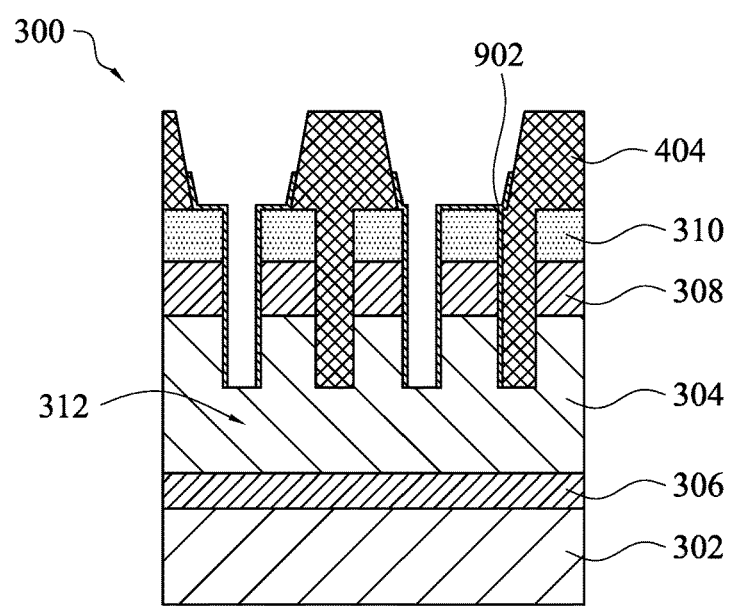

The method 200 then proceeds to block 210 where the spacer material layer is etched. The etching may be an anisotropic etch. In an embodiment, a reactive ion etch (ME) process is utilized. The ME process may include a halogen plasma and/or be performed at a temperature of between approximately 20 and approximately 120 degrees Celsius. As illustrated in the example of FIG. 10, the spacer material layer 902 has been removed from the bottom of the trench 312 in the openings 906 and 908. The spacer material layer has also been removed from portions of the exposed surface of the layer 404.

Figure 11:
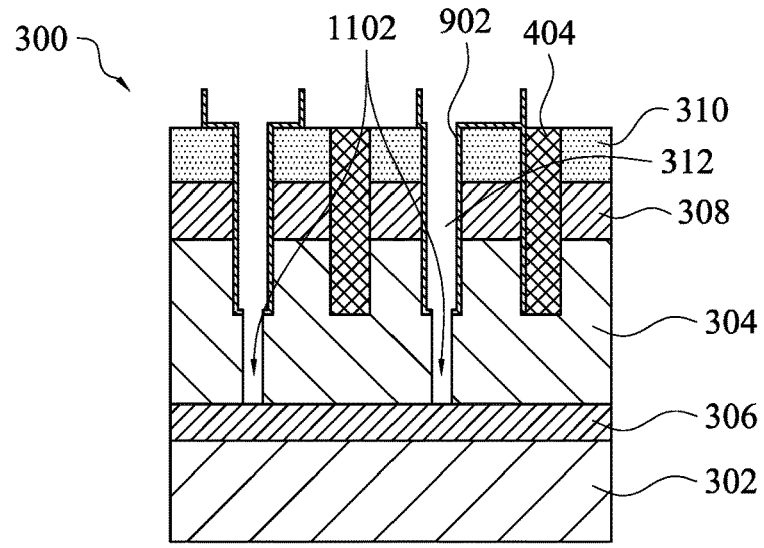
Figure 12:
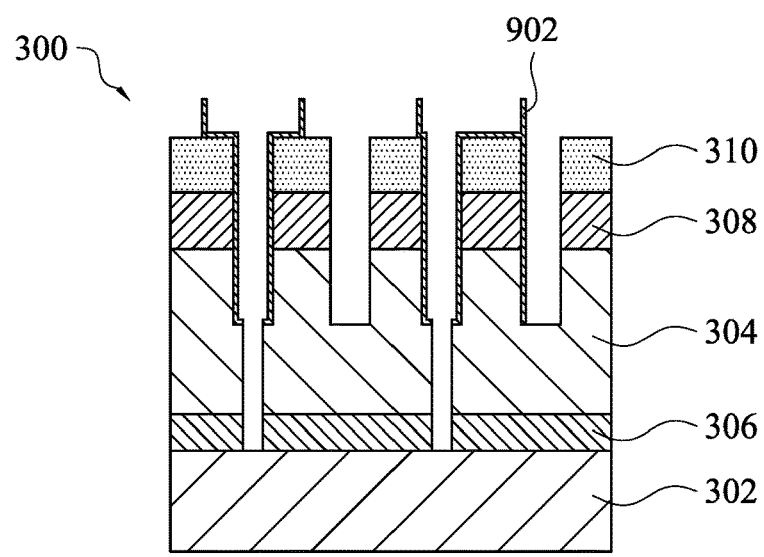
Figure 13:
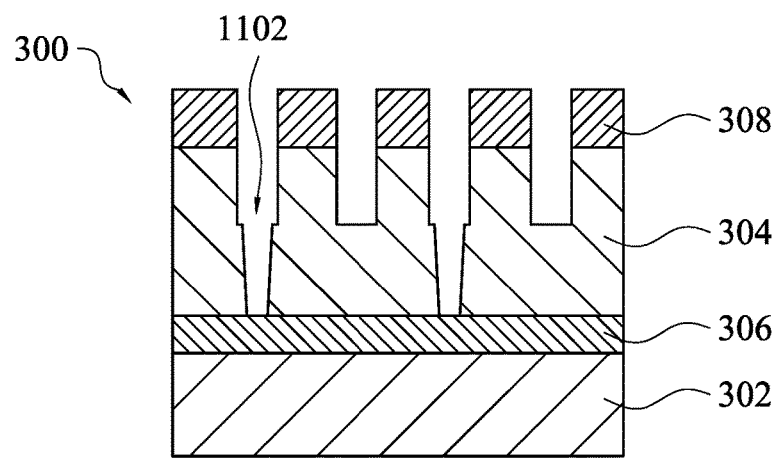
Figure 14:
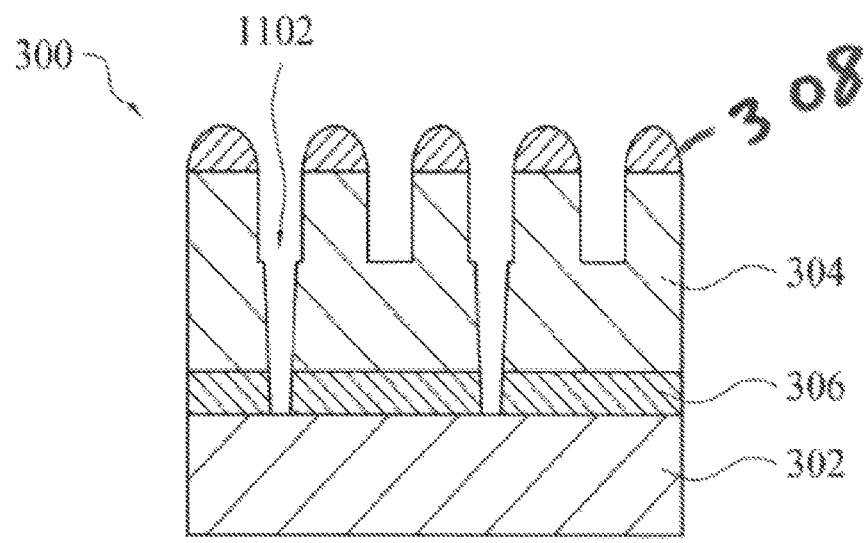
Figure 15:
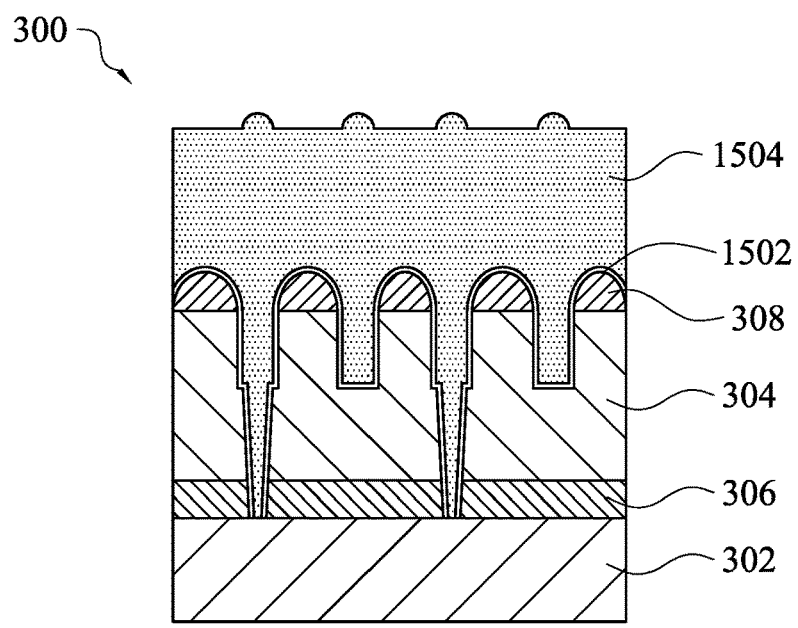

The method 200 then proceeds to block 212 where a via hole is etched in the dielectric layer using the etched spacer material and via pattern as masking elements. The via hole may be etched in a dielectric layer such as a low-k dielectric layer. As indicated above, the spacer material may be selected such that an etch selectivity is provided between the spacer material (which is not substantially etched) and the dielectric material (e.g., low-k material). In an embodiment, the etch selectivity is greater than approximately 15. Referring to the example of FIG. 11, a via hole 1102 is etched in the dielectric layer 304. The via hole 1102 is etched using the spacer material layer 902 as a masking element. The via hole 1102 is connected to and extends downward from the trench pattern 312 discussed above with reference to block 202. As illustrated by FIG. 11, in embodiments, the spacer material layer 902 provides for a decreased width of a via hole 1102 as compared to that defined by the via pattern defined in previous layers, e.g., opening 502 in hard mask 308/310.

In some embodiments, after the etching of the target dielectric layer to form the via holes, one or more layers is removed from the substrate, including, for example, patterning layers discussed above at block 204. Referring to the example of FIG. 12, the bottom layer 404 is removed from the substrate 302. In an embodiment, the bottom layer 404 is removed using a wet strip, ashing, or other suitable process.

The method 200 then proceeds to block 214 where the spacer material is removed from the substrate. The spacer material may be removed by a wet etching process. Exemplary removal processes include removal by a hydrogen peroxide ($H_2O_2$) etch. The removal process may include approximately 100 to approximately 2000 ppm of $H_2O_2$. The removal process may be performed for between approximately 20 and approximately 200 seconds, by way of example. The removal process may include spinning the substrate at a speed of approximately 30 to approximately 300 rpm, again by way of example. Referring to the example of FIG. 13, the spacer material layer 902 has been removed from the substrate 302. Contemporaneously with the removal of the spacer material 902, the hard mask layer 310 may also be removed. It is noted in some examples, the spacer material 902 and the hard mask layer 310 have the same composition.

The method 200 then proceeds to block 216 where the via hole bottom is opened. In an embodiment, the via hole bottom is opened to expose a conductive surface of an underlying feature including, but not limited to, a gate stack, a source/drain region, a capacitor plate, a metal line (e.g., metal-1), a contact pad, etc. disposed on the substrate. Referring the example of FIG. 14, the etch stop layer 306 has been removed underlying the via hole 1102.

The method 200 then proceeds to block 218 where a conductive material is formed in the trench and/or via hole(s) formed previously in the method 200. The conductive material may be formed using one or more deposition steps, such as, ALD, PVD, CVD, plating (ECP), and/or other suitable processes. The conductive material may include barrier layers, seed layers, liner layers, and/or other multi-layer structures. Exemplary conductive materials include aluminum (Al), copper (Cu), tungsten (W), Cobalt (Co), respective alloys, combinations thereof, and/or other suitable conductive material. In an embodiment, the via hole 1102 and the trench 312 are filled contemporaneously with the same conductive material(s). Referring to the example of FIG. 15, a conductive barrier layer 1502 and a conductive plated layer 1504 are disposed on the substrate 302 in the via holes 1102 and trenches 312.

Figure 16:
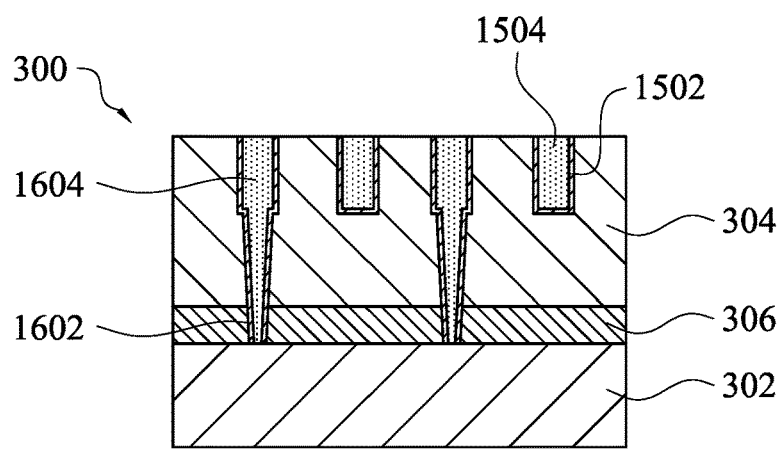
Figure 17:
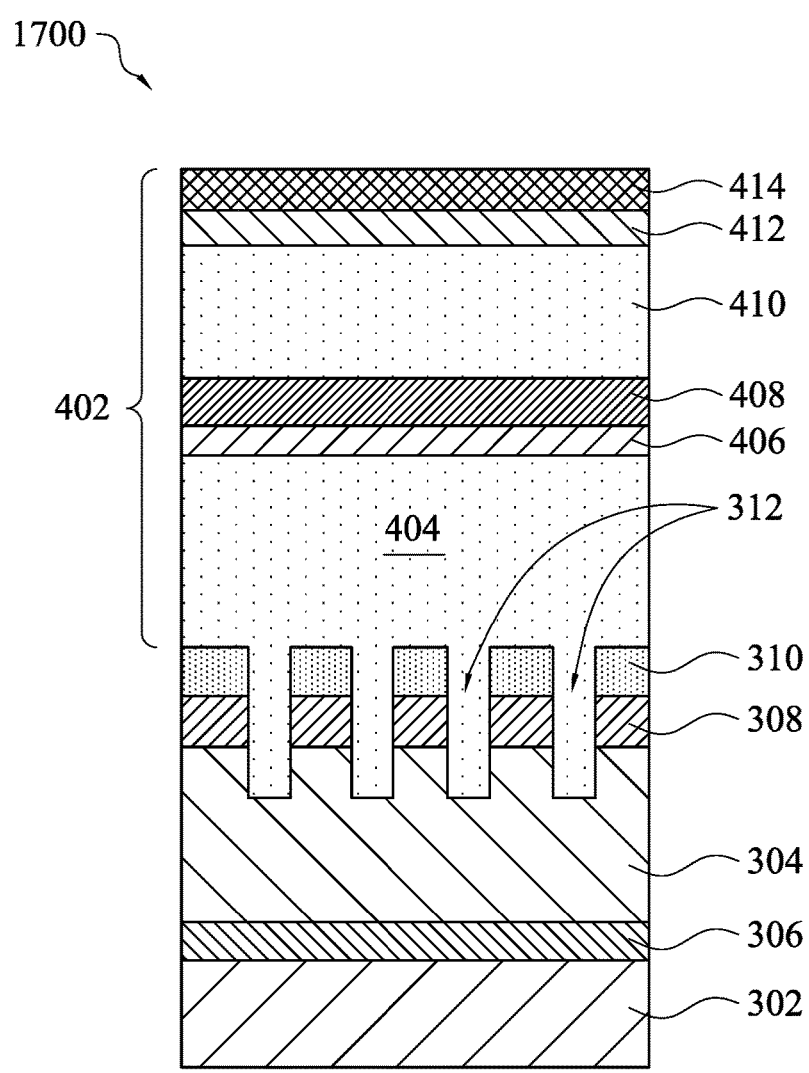
FIGS. 17-26 are cross-sectional views of another example of a semiconductor device according to various steps of the method of FIG. 2.

After the deposition of the conductive material, a planarization process, such as performed by a chemical mechanical polishing apparatus, may be performed. FIG. 16 is exemplary of the device after planarization illustrating via 1602 and metal line 1604 of an MLI structure of device 300. The via 1602 may be referred to as $V_x$, while the metal line 1604 may be referred to as $M_{x+1}$, where x is the layer of the back-end metallization process.

Thus, FIGS. 3-16 provide exemplary embodiments of a device 300 according to one or more steps of the method 200 of FIG. 2. The device 300 and the method 200 are illustrative of embodiments of the method 100 of FIG. 1 that provide for budgeting for misalignment of a via pattern after forming the via pattern on the substrate. In other words, the spacer material is disposed on the sidewalls of the trench after defining the via pattern; thus, the spacer material may be disposed in the regions of the trench unprotected by the via pattern. As illustrated above, embodiments of the method 200 provide for self-alignment of the via holes with the trenches of the conductive traces. Embodiments of the method 200 also provide for accounting for a misalignment of the via pattern up to a distance of the twice the thickness of the spacer material during this self-alignment process. Embodiments of the method 200 may also serve to provide for a smaller CD (e.g., width) of a via hole. Another advantage of an embodiment of the method 200 is the simultaneous removal of the spacer material and a hard mask layer (e.g., metal hard mask) as illustrated by the removal of the spacer material 902 and the hard mask layer 310, see FIGS. 12-13.

FIGS. 17-26 provide another exemplary embodiment of the method 200 of FIG. 2, exemplified using a device 1700. Many of the aspects of the device 1700 are similar to those discussed above with reference to FIGS. 3-16, with differences noted in the following discussion. The method 200, an embodiment of the method 100, is again discussed to illustrate the embodiment of the device 1700 and FIGS. 17-26.

Thus, referring now to FIG. 2 and FIGS. 17-26, illustrated is the method 200 of fabricating a interconnect structure for a semiconductor device. The interconnect structure (e.g., MLI) includes conductive line(s) and via(s).

As discussed above, at block 202 a substrate having a trench pattern is provided. Referring to the example of FIG. 17, the substrate 302 is provided having the trench pattern 312 disposed thereon. The substrate 302, trench pattern 312, etch stop layer 306, dielectric layer 304, hard mask layer 308, and hard mask layer 312 are substantially similar to as discussed above with reference to FIGS. 2 and 3.

Again as discussed above, the method 200 then proceeds to block 204 where patterning material(s) are formed on the substrate. Referring to the example of FIG. 17, the plurality of patterning materials 402 are formed on the substrate 302. The stack of patterning materials 402 is exemplary only and not intended to be limiting beyond what is specifically claimed. The patterning materials 402 include the first bottom layer 404, the hard mask layer 406, the hard mask layer 408, the second bottom layer 410, the middle layer 412, and the photosensitive layer 414. One or more of the layers 404, 406, 408, 410, 412, 414 may be substantially similar to as discussed above with reference to FIGS. 2 and 4.

The method 200 then proceeds to block 206 where a via pattern is defined. The via pattern may be defined using the patterning material(s) discussed above. The via pattern may be associated with the layer/level of vias that will be formed underlying the conductive interconnect layer defined by the trench pattern described above in block 202. In an embodiment, the via pattern defines the contact pattern providing interconnection to, for example, gate structures, source features, drain features, capacitors, etc. In an embodiment, the via pattern defines the via pattern providing interconnection between layers of a multi-layer interconnect (MLI) structure. The via pattern may be defined in multiple steps (e.g., with multiple exposures of photosensitive material(s)). The multiple steps (photo/etch) may provide for a reduced spacing (e.g., pitch) between contact features.

Figure 18:
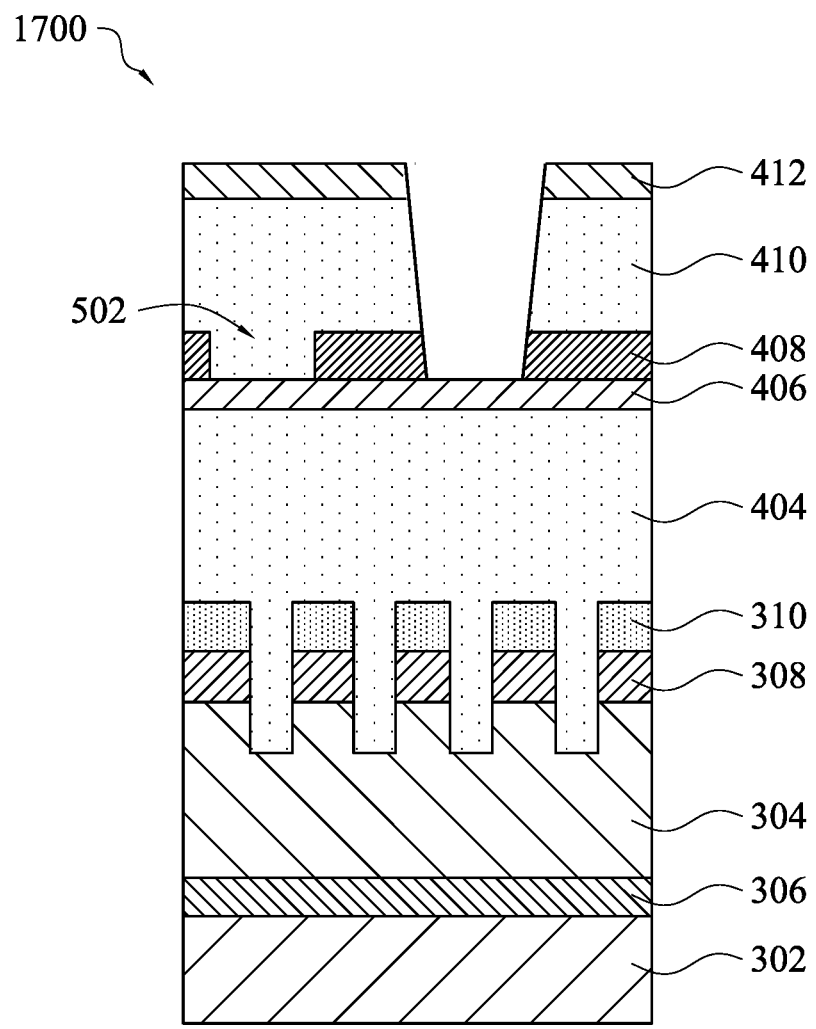
Figure 19:
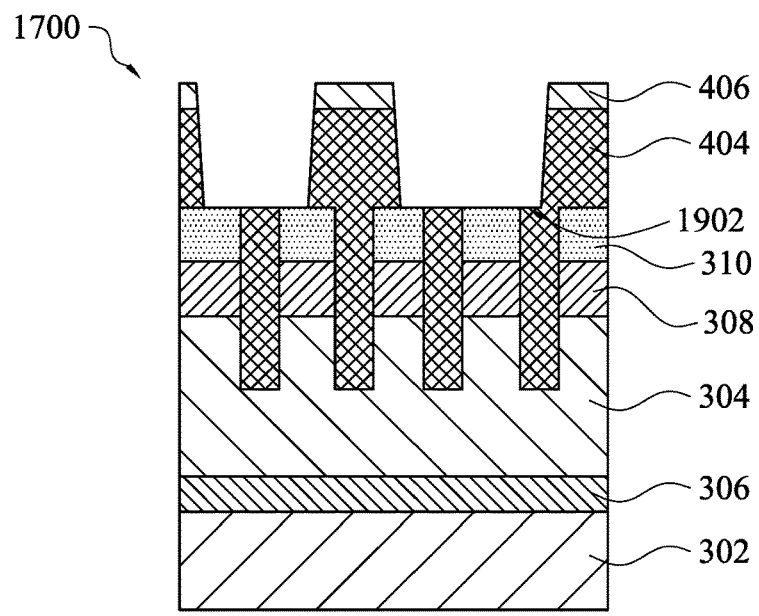

Referring to the example of FIG. 18, a first portion for of the via pattern (502) is formed in the hard mask layer 408 and subsequently a second portion of the via pattern is formed in the hard mask layer 408 (opening 602 in the layers 410 and 412 illustrated in FIG. 18). The via pattern is then defined in one or more underlying layers. Referring to the example of FIG. 19, the pattern defined by openings 502 and 602 is transferred to the bottom layer 404 and/or the etch stop layer 406. The via pattern provides openings 502 and 602 are disposed over the trenches 312. It is noted that, as discussed above with reference to FIG. 9, FIG. 19 is also illustrative of a misaligned or mislanded via pattern illustrated in opening 602. This misalignment is illustrated by region 1902 of the opening 602 which overlays another trench feature of the trench pattern 312. This misalignment can provide processing and device performance issues as discussed above with reference to FIG. 9 and block 206 and described with reference to FIG. 20 below.

Figure 20:
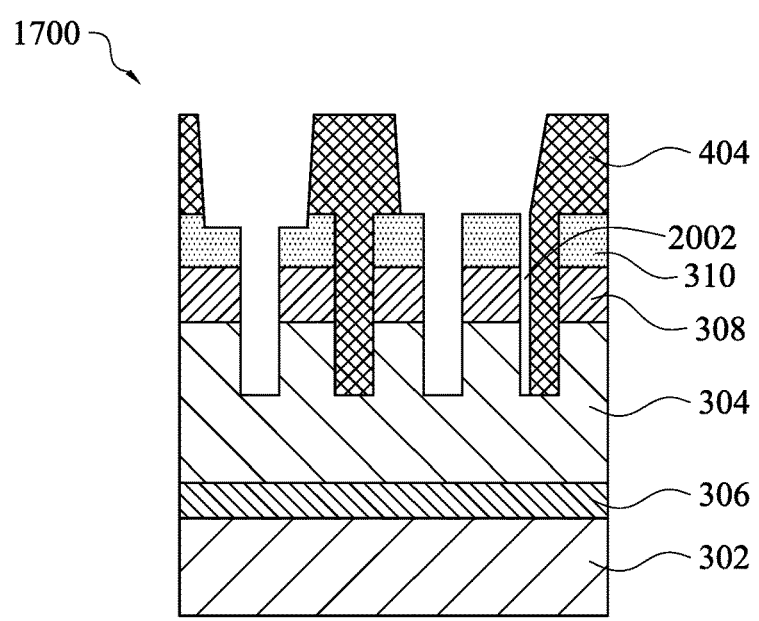

Block 206 continues to etch the bottom layer, illustrated by layer 404, such that the bottom layer 404 is removed from the region defined by the via pattern. FIG. 20 is illustrative of the bottom layer 404 having been etched. It is noted that because of the misaligned via pattern, a region or gap 2002 is formed wherein the bottom layer 404 is undesirably removed from the trench 312 adjacent the targeted via hole.

The method 200 then proceeds to block 208 where spacer material is formed on the via pattern defined by block 206. The thickness of the spacer material may be determined such that it is sufficient to fill any unmasked region or gap that results from the misalignment in the via pattern. The spacer material may have compositions including, for example, amorphous carbon (a-Carbon). In an embodiment, the spacer material layer is formed by atomic layer deposition (ALD). Exemplary thicknesses of the spacer material layer include those between approximately 2 and approximately 5 nanometers. As discussed with reference to FIG. 37 below, the selection of the thickness of the spacer material layer should be such that twice the thickness will fill a maximum distance of misalignment that may occur.

The spacer material layer, for example a-Carbon, may be formed using a process temperature of between approximately 50 and approximately 200 degrees Celsius. The process temperature may be selected such that it prevents any collapse of surrounding layers (e.g., bottom layer 404), prevents outgassing, and/or other process considerations. The process pressure (for example for depositing the a-Carbon) may be between approximately 0.1 and approximate 5 torr. The process pressure may be selected such that it prevents any collapse of surrounding layers (e.g., bottom layer 404), prevents outgassing, and/or other process considerations. The gas flow for forming the a-Carbon layer may include $C_2H_4$, Ar, and/or Ne provided at a flow rate between approximately 100 and approximately 1000 sccm.

Figure 21:
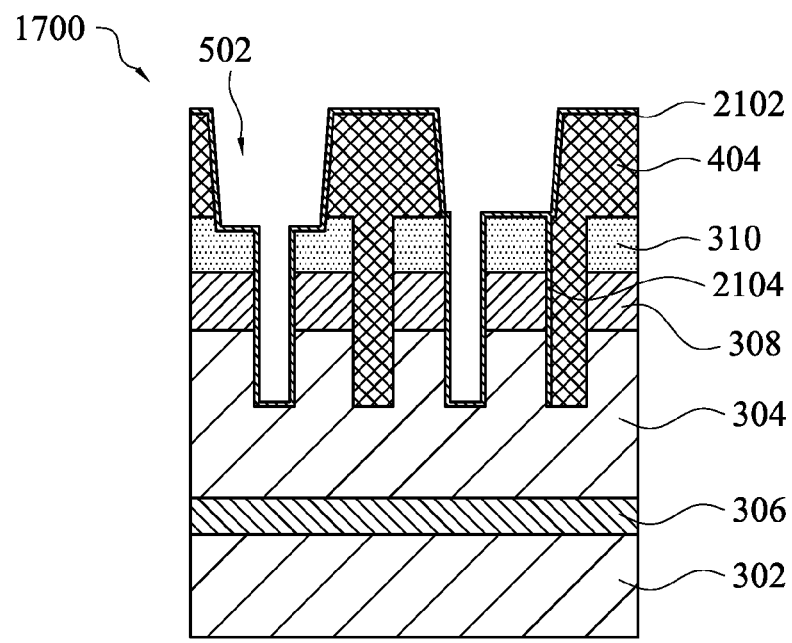

Referring to the example of FIG. 21, a spacer material layer 2102 is formed on the substrate 302. The spacer material layer 2102 may be a conformal layer. The spacer material layer 2102 may be a-Carbon. The spacer material layer 2102 fills the gap 2002 caused by of misalignment, thereby forming merged region 2104.

Figure 22:
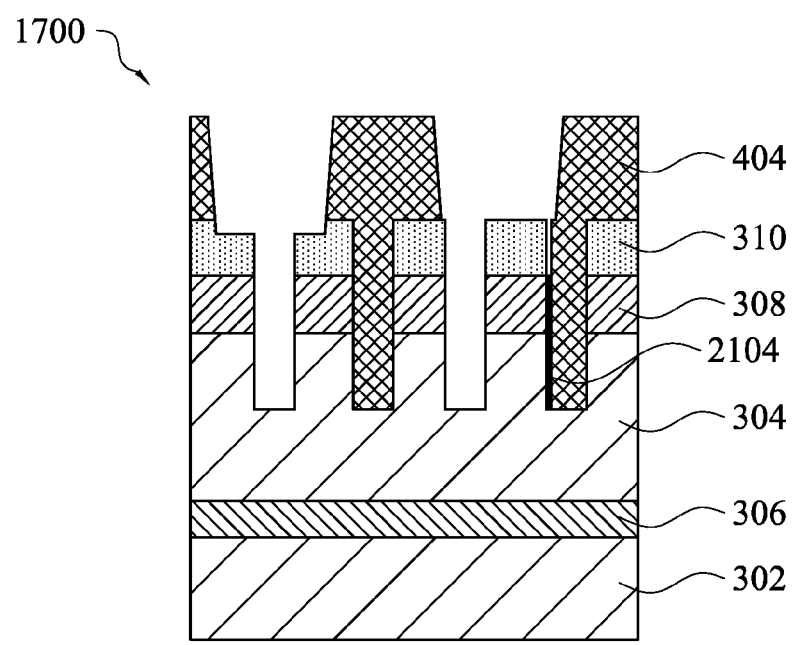
Figure 23:
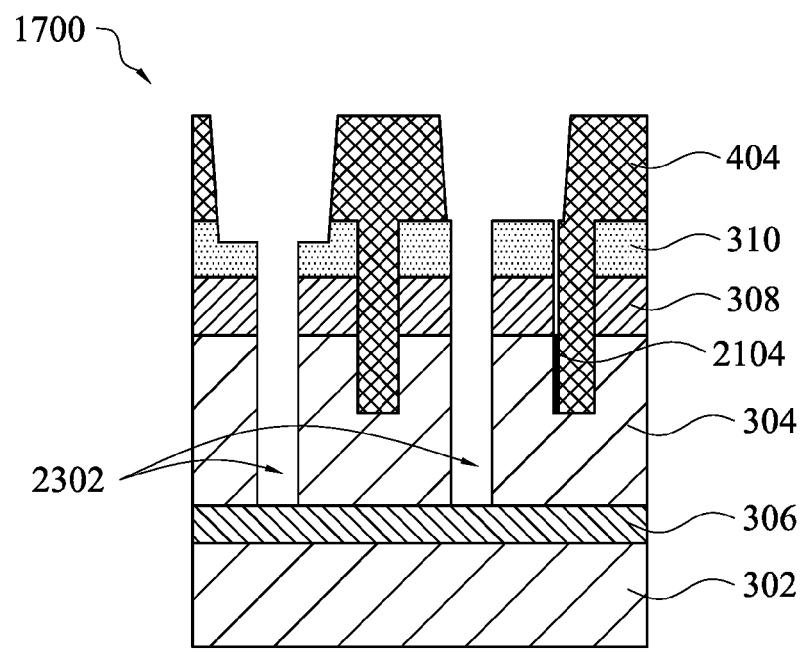

The method 200 then proceeds to block 210 where the spacer material layer is etched. The etching may be an isotropic etch. In an embodiment, a plasma etch is provided. The plasma process may include a plasma created by carbon fluoride. The plasma process may be provided at a temperature of between approximately 20 and approximately 120 degrees Celsius. As illustrated in the example of FIG. 22, the etch includes etching the spacer material layer 2102 such that it is removed from the trenches 312 in the openings 502 and 602, but remains filling at least a portion of gap 2002. The spacer material layer 2102 of the region 2104 has a height that extends above the surface of the dielectric layer 304. In an embodiment, the region 2104 of the spacer material layer 2102 has a height of greater than approximately 300 Angstroms.

The method 200 then proceeds to block 212 where a via hole is etched in the dielectric layer using the etched spacer material and via pattern as masking elements. The via hole may be etched in a dielectric layer such as a low-k dielectric layer. Referring to the example of FIG. 23, a via hole 2302 is etched in the dielectric layer 304. During the etching, the spacer material layer in region 2104 protects the dielectric layer 304 from etching. The via hole 2302 is connected to and extends downward from the trench pattern 312 discussed above with reference to block 202. In other words, the via hole 2302 may be associated with Vx, while the trench 312 is associated with Mx+1, where x is the layer number of the back-end of the line metallization process.

In some embodiments, after the etching of the target dielectric layer to form the via holes, one or more layers are removed from the substrate, including, for example, patterning layers discussed above at block 204. Referring to the example of FIG. 24, the bottom layer 404 is removed from the substrate 302. In an embodiment, the bottom layer 404 is removed using a wet strip, ashing, or other suitable process.

Figure 24:
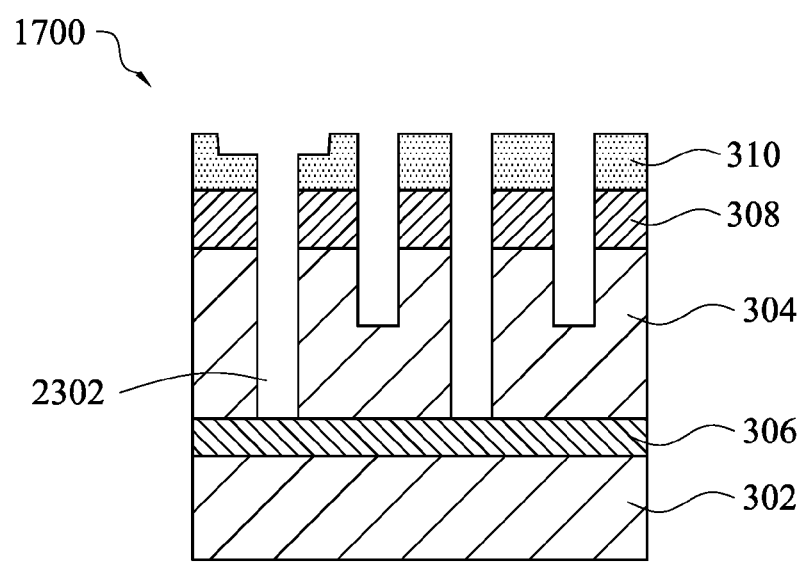
Figure 25:
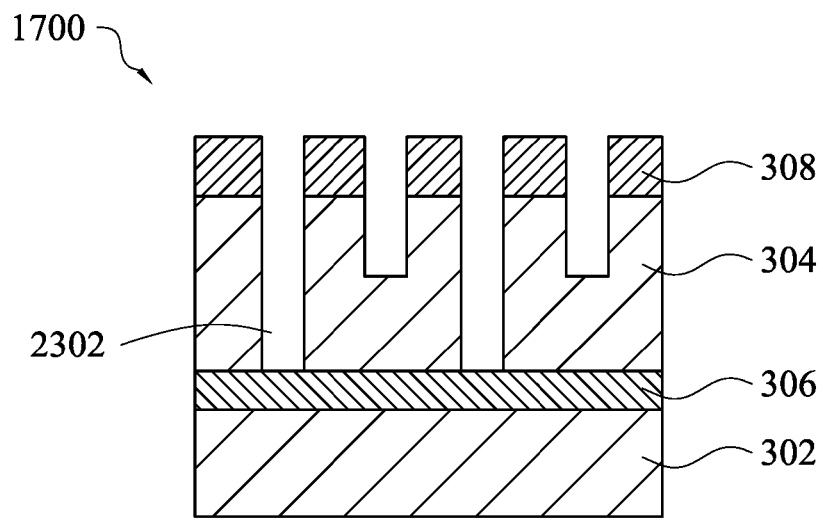
Figure 26:
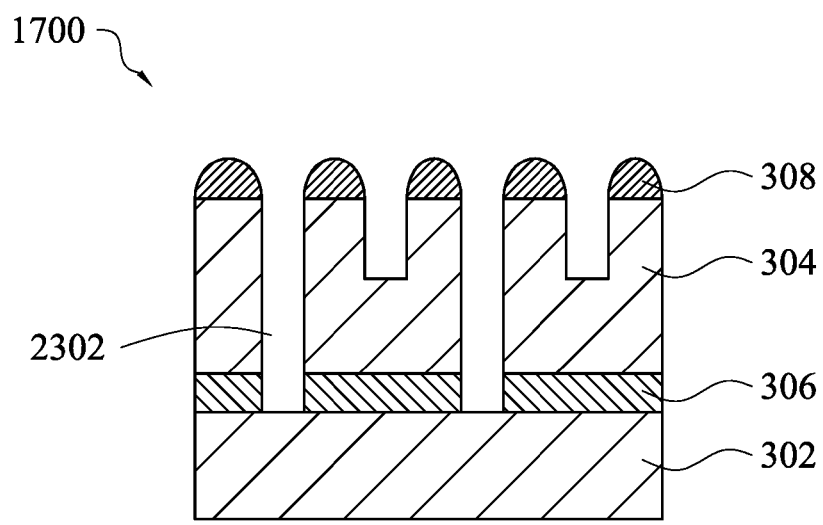

The method 200 then proceeds to block 214 where the spacer material is removed from the substrate. The spacer material may be removed concurrently with the bottom layer 404, as illustrated in FIG. 24. Alternatively, the spacer material lay be removed in a separate step. Separately or concurrently, the hard mask layer 310 (e.g., TiO/TiN) may also be removed as illustrated in FIG. 25.

The method 200 then proceeds to block 216 where the via hole bottom is opened. In an embodiment, the via hole bottom is opened to expose a conductive surface of an underlying feature including, but not limited to, a gate stack, a source/drain region, a capacitor plate, a metal line (e.g., metal-1), a contact pad, or other features disposed on or over the substrate. Referring the example of FIG. 126, the etch stop layer 306 has been removed underlying the via hole 2302.

The method 200 then proceeds to block 218 where a conductive material is formed in the trench and/or via hole(s) formed previously in the method 200. This is substantially similar to as discussed above with reference to FIGS. 2, 15 and 16. Thus, the via holes 2302 and trenches 312 provide for a via and conductive line of a multi-layer interconnect structure.

Thus, FIGS. 17-26 provide exemplary embodiments of a device 1700 according to one or more steps of the method 200 of FIG. 2. The device 1700 and the method 200 are illustrative of embodiments of the method 100 of FIG. 1 that provide for a budget for misalignment of a via pattern after forming the via pattern on the substrate. In other words, the spacer material is disposed on the sidewalls of the trench after the defining of the via pattern; thus, the spacer material may be provided in the regions of the trench unprotected by the via pattern. Embodiments of the method 200 and the device 1700 provide for self-alignment of the via holes with the trenches of the conductive traces. Embodiments of the method 200 and the device 1700 also provide for accounting for a misalignment of the via pattern up to a distance of the twice the thickness of the spacer material during this self-alignment process. Embodiments of the method 200 and device 1700 also serve to provide for a CD (e.g., width) of a via hole as defined by the via pattern and self-alignment with the trench.

Referring now to FIG. 27, illustrated is a method 2700 of fabricating a interconnect structure for a semiconductor device. The method 2700 may be another exemplary embodiment of the method 100, described above with reference to FIG. 1. FIGS. 28-36 are exemplary embodiments of a semiconductor device 2800 according to one or more steps of the method 2700.

The method 2700 begins at block 2702 where a substrate having a pattern of trenches is provided. Block 2702 may be substantially similar to block 102 of the method 100, described above with reference to FIG. 1 and/or block 202 of the method 200, described above with reference to FIGS. 2, 3, and 17. Referring to the example of FIG. 28, a substrate 302 is provided. The substrate 302 may be substantially similar to as discussed above with reference to FIGS. 3 and 17. The device 2800 further includes the dielectric layer 304 (e.g., low-k dielectric), the etch stop layer 306, the first hard mask layer 308, and the second hard mask layer 310 which are also substantially similar to as discussed above with reference to FIGS. 2, 3, and 17.

As discussed in the previous embodiments, the trenches 312 may provide for defining a pattern for the routing of a conductive feature such as a metal layer or line of an interconnect structure for the device 2800 in the dielectric layer 304. For example, the trenches 312 may define the routing of a metal layer such as, metal-1, metal-2, etc. The trenches 312 may be substantially similar to as discussed above with reference to block 102 and/or block 202 above.

The method 2700 then proceeds to block 2704 where spacer material is formed on the trench pattern. The thickness of the spacer material may be determined such that it is sufficient to fill any region of misalignment in the via pattern that will be subsequently formed. Exemplary thicknesses of the spacer material layer include those between approximately 4 and approximately 6 nanometers. However, the selection of the thickness of the spacer material layer may be such its thickness will fill a maximum distance of misalignment that may occur.

The spacer material may have compositions including, for example, TiO, TiN or other suitable material having a sufficient etch selectivity ratio (e.g., with reference to the dielectric layer within which the via hole will be formed). In an embodiment, the spacer material layer is formed by atomic layer deposition (ALD). The spacer material layer may be formed using a process temperature of between approximately 100 and approximately 250 degrees Celsius. The process temperature may be selected such that it prevents any collapse of surrounding layers (e.g., bottom layer 404), prevents outgassing, and/or other process considerations. The process pressure may be between approximately 0.1 and approximate 10 torr. The process pressure may be selected such that it prevents any collapse of surrounding layers (e.g., bottom layer 404), prevents outgassing, and/or other process considerations.

Figure 29:
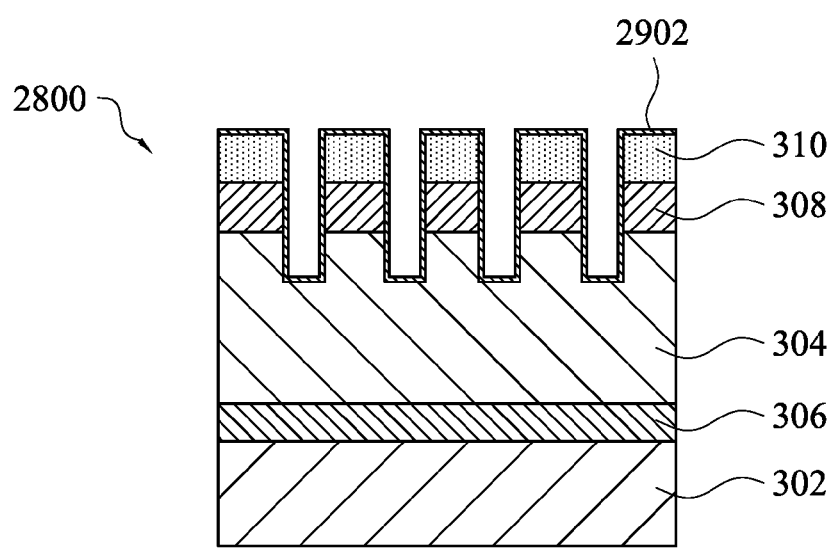

Referring to the example of FIG. 29, a spacer material layer 2902 is formed on the substrate 302. The spacer material layer 2902 may be a conformal layer.

Figure 30:
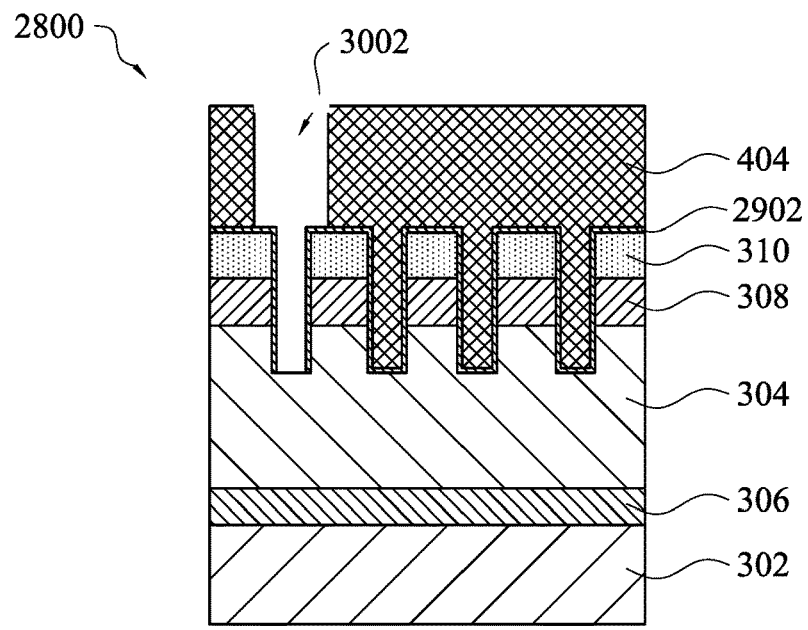
Figure 31:
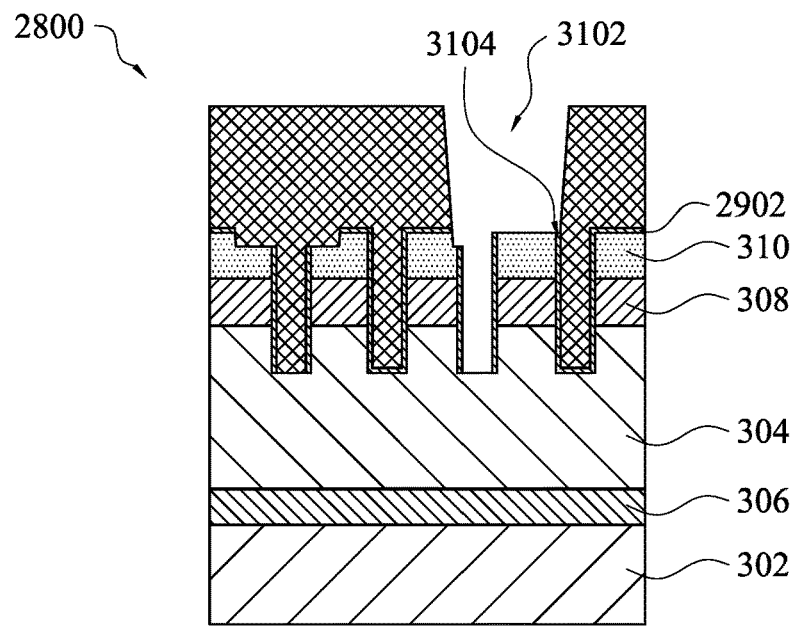
Figure 32:
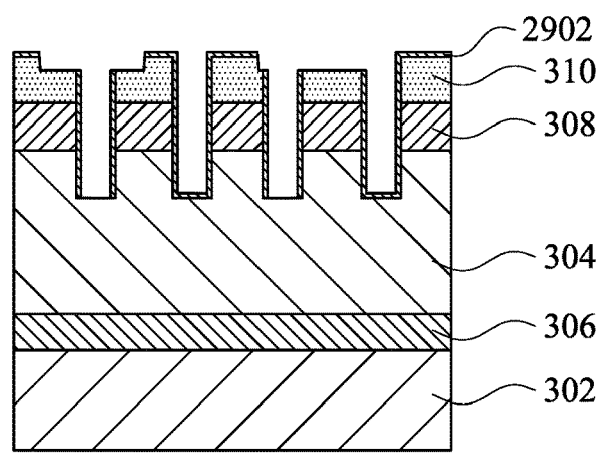

The method 2700 then proceeds to block 2706 where a via pattern is defined. The via pattern may be defined using various patterning material(s) including photosensitive materials, antireflective coatings, hard mask layers, tri-layer resists, and/or other suitable layers. The via pattern may be associated with the layer/level of vias that will be formed underlying the conductive interconnect layer defined by the trench pattern described above in block 2702. In an embodiment, the via pattern defines the contact pattern providing interconnection to, for example, gate structures, source features, drain features, capacitors, etc. In an embodiment, the via pattern defines interconnection between layers of a multi-layer interconnect (MLI) structure. The via pattern may be defined in multiple steps (e.g., with multiple exposures of photosensitive material(s)). The multiple steps (photo/etch) may provide for a reduced spacing (e.g., pitch) between contact features. A multi-step lithography/etch sequence is illustrated in FIGS. 30 and 31, which illustrate a first via pattern portion formed providing opening 3002 and a second via pattern portion formed providing opening 3102. FIGS. 30 and 31 illustrate the patterning in layer 404, which may be substantially similar as discussed above. Other patterning layers may also be similarly used as discussed above, for example, with reference to FIGS. 4-7 and 17-19.

In creating the via pattern openings 3002 and 3102, the spacer material layer 2902 is removed from the bottom of the trenches 312 in the openings 3002 and 3102, see FIGS. 30 and 31.

As illustrated by FIG. 31, a misaligned via pattern 3102 extends over the spacing (e.g., dielectric material between trench) as illustrated by region 3104. However, due to the spacer material 2902, the opening 3102 does not extend into any adjacent trench.

After forming the via pattern and patterning the spacer layer 2902, the bottom layer 404 is removed from the substrate. Referring to the example of FIG. 32, the bottom layer 404 is removed from the substrate 302. In an embodiment, the bottom layer 404 is removed using a wet strip, ashing, or other suitable process.

Figure 33:
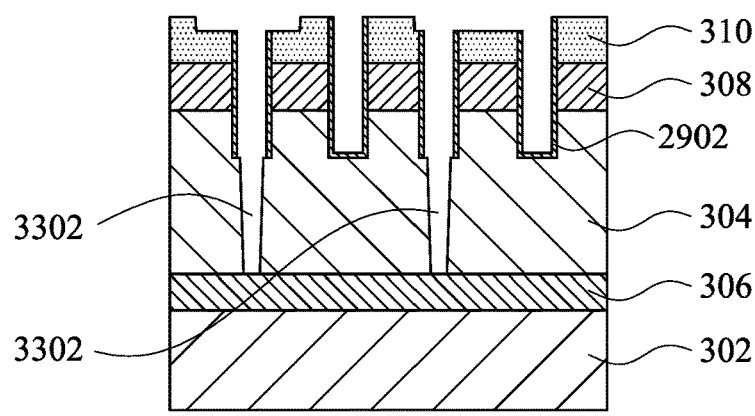
Figure 34:
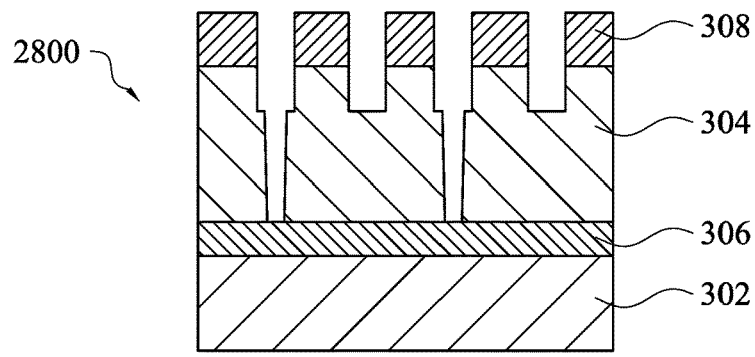
Figure 35:
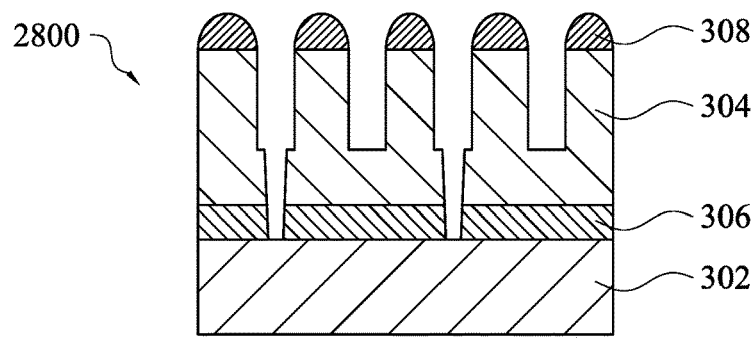

The method 2700 then proceeds to block 2708 where a via hole is etched in the dielectric layer using the remaining spacer material as a masking element. The via hole may be etched in a dielectric layer such as a low-k dielectric layer. The spacer material may be selected such that an etch selectivity is provided between the spacer material (which is not substantially etched) and the dielectric material (e.g., low-k material). In an embodiment, the etch selectivity is greater than approximately 15. Referring to the example of FIG. 33, via holes 3302 are etched in the dielectric layer 304. The via holes 3302 are etched using the spacer material layer 2902 as a masking element (e.g., defining the width and position of the via holes). The via holes 3302 are connected to and extend downward from the trench pattern 312 discussed above with reference to block 2702. In other words, the via holes 3302 provide $V_x$, while the trenches 312 provide $M_{x+1}$, where x is the level of interconnect. As illustrated by FIG. 33, in embodiments, the spacer material layer 2902 provides for a decreased width of a via hole 3302 as compared to the via pattern defined in previous patterning layers, for example as illustrated in FIGS. 30, 31.

The method 2700 then proceeds to block 2710 where the spacer material is removed from the substrate. The spacer material may be removed by a wet etching process. Exemplary removal processes include removal by a hydrogen peroxide ($H_2O_2$) etch. The removal process may include approximately 100 to approximately 2000 ppm of $H_2O_2$. The removal process may be performed for between approximately 20 and approximately 200 seconds, by way of example. The removal process may include spinning the substrate at a speed of approximately 30 to approximately 300 rpm, by way of example. In an embodiment, a hard mask layer may be removed from the substrate contemporaneously with the spacer material. Referring to the example of FIG. 34, the spacer material layer 2902 has been removed from the substrate 302. Hard mask layer 310 is also removed by the process removing the spacer material layer 2902.

The method 2700 then proceeds to block 2712 where the via hole bottom is opened. In an embodiment, the via hole bottom is opened to expose a conductive surface of an underlying feature including, but not limited to, a gate stack, a source/drain region, a capacitor plate, a metal line (e.g., metal-1), a contact pad, or other feature disposed on the substrate. Referring the example of FIG. 35, the etch stop layer 306 has been removed underlying the via hole 3302.

Figure 36:
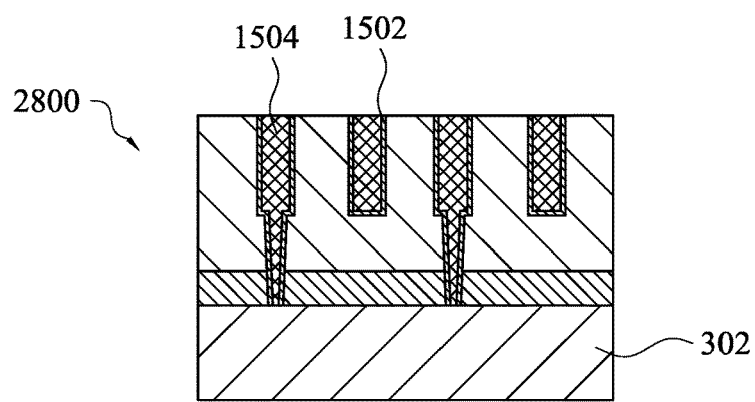

The method 200 then proceeds to block 2714 where a conductive material is formed in the trench and/or via hole(s) formed previously in the method 2700. The conductive material may be formed using one or more deposition steps, such as, ALD, PVD, plating (ECP), and/or other suitable processes. The conductive material may include barrier layers, seed layers, liner layers, and/or other multi-layer structures. Exemplary conductive materials include aluminum (Al), copper (Cu), tungsten (W), respective alloys, combinations thereof, and/or other suitable conductive material. In an embodiment, the via hole 3302 and the trench 312 are filled contemporaneously with the same conductive material(s). Referring to the example of FIG. 36, a conductive barrier layer 1502 and a conductive plated layer 1504 are disposed on the substrate 302 in the via holes 3302 and trenches 312. During formation of the conductive layers a chemical mechanical polishing to planarize the layers may be performed. FIG. 36 is exemplary of the device after planarization.

Thus, FIGS. 28-36 provide exemplary embodiments of a device 2800 according to one or more steps of the method 2700 of FIG. 27. The device 2800 and the method 2700 are illustrative of embodiments of the method 100 of FIG. 1 that provide for a budget for misalignment of a via pattern in advance of forming the via pattern on the substrate. In other words, the spacer material is disposed on the sidewalls of the trench prior to defining the via pattern. However, like the embodiments of the method 200 of FIG. 2, the method 2700 provides for self-alignment of the via holes with the trenches of the conductive lines or traces. Embodiments of the method 2700 also provide for accounting for a misalignment of the via pattern up to a distance of the thickness of the spacer material during this self-alignment process. Embodiments of the method 2700 also serve to provide for a smaller CD (e.g., width) of a via hole as discussed above. In an embodiment, the CD is smaller than the via pattern by twice the thickness of the spacer layer. Another advantage of an embodiment of the method 2700 is the simultaneous removal of the spacer material and a hard mask layer (e.g., metal hard mask) as illustrated by the removal of the spacer material 2902 and the hard mask layer 310, see FIGS. 33-34.

Figure 37:
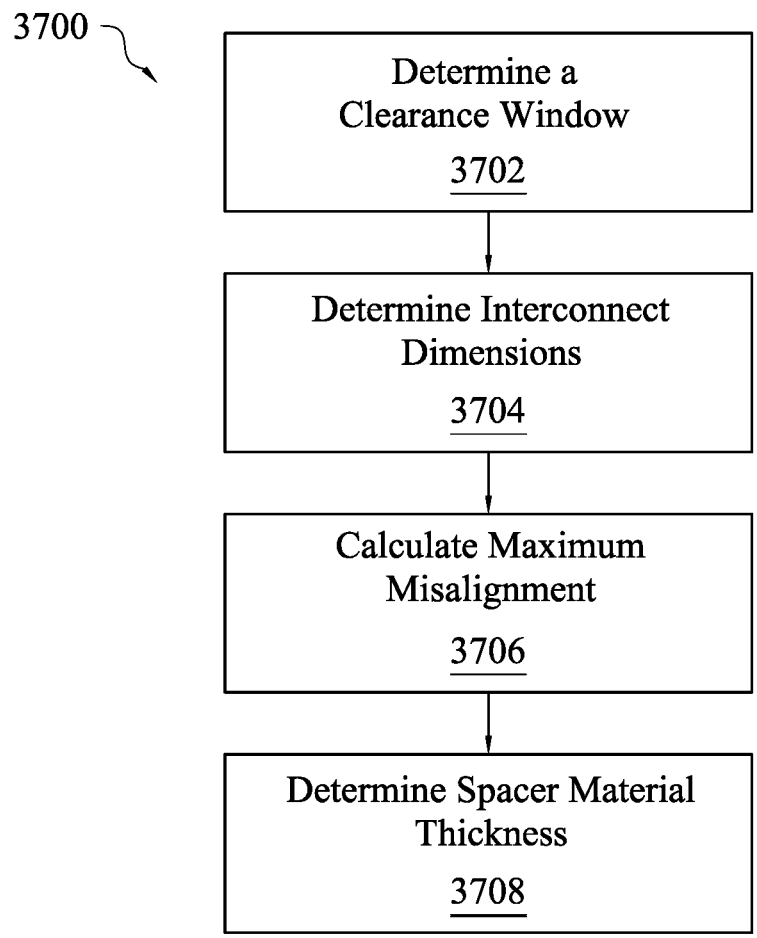
FIG. 37 is a flowchart of an embodiment of determining a spacer material thickness for the methods of FIGS. 2 and/or 27.

Referring now to FIG. 37, illustrated is a method 3700 of determining a desired thickness of a spacer material layer, such as the spacer material layer discussed above with reference to blocks 208 and/or 2704 of the method 200 and 2700 respectively. The method 3700 begins at block 3702 where a clearance window for via placement is determined. The clearance window may be a distance value (e.g., nanometers) that accounts for the processes critical dimension uniformity (CDU) as well as overlay budget for the process. For example, in an embodiment, the clearance window is approximately 9.6 nm for a 193-i lithography process.

The method 3700 then proceeds to block 3704 where a pitch of the spacing and trench are determined. As illustrated in FIGS. 38a, 38b, 38c, 38d, a space (material interposing defined opening for trenches) has a width S and a trench (defining the metal interconnect line to be formed) has a width W. In an embodiment, the pitch of the space and trench is 30 nm (½S+W+½S).

The method 3700 then proceeds to block 3706 where a maximum distance of displacement for a mislanded or misaligned via is determined. The maximum distance of displacement may be equal to (the trench CD (W)+2*the clearance window)–pitch. By way of example, if S is 15 nm and W is 15 nm and the clearance window is 9.6 nm, the maximum distance of misalignment is =15+2*9.6–30 or 4.2 nm.

The method 3700 then proceeds to block 3708 where the desired spacer material thickness is determined. For the embodiments of the method 200 where the spacer material is deposited after the via pattern is defined, the thickness of the spacer material thickness may equal approximately ½ of the maximum distance of misalignment. For the embodiments of the method 2700 where the spacer material is deposited before the via pattern is defined, the thickness of the spacer material may equal substantially the maximum distance of misalignment.

Figure 38D:
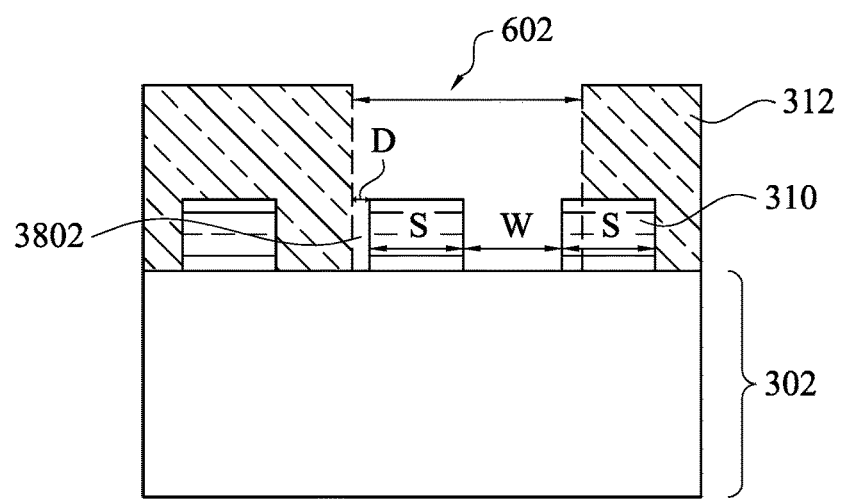

A distance of misalignment or mislanding is illustrated in FIG. 38d as region 3802 having a width D, the distance of misalignment. The region 3802 may be substantially similar to region 802 of FIG. 8 and/or region 2002 of FIG. 20. In contrast, see FIG. 38b which shows alignment of the via pattern opening 502 and the trench 312.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Thus, one of the broader embodiments presented herein, provided is a method of semiconductor fabrication. The method includes providing a substrate having a plurality of trenches disposed in a dielectric layer formed above the substrate. A via pattern including is defined. A spacer material layer is formed on sidewalls of the trenches. Via holes are etched in the dielectric layer using the via pattern and spacer material layer as a masking element.

In another of the embodiments described, a method of semiconductor device fabrication includes providing a substrate having a dielectric layer formed over the substrate. A trench pattern is formed in the dielectric layer. The trench pattern is associated with a layer of a multi-layer interconnect structure a semiconductor device. A via pattern is defined in a patterning layer disposed over the trench pattern. A spacer material layer is formed on the defined via pattern in the patterning layer. A via hole is etched using the spacer material layer as a masking element.

In yet another of the embodiments described, a method includes providing a substrate having a plurality of trenches formed in a dielectric layer disposed over the substrate. The trenches provide a routing for an interconnection layer of a semiconductor device. A conformal layer of spacer material is formed over the substrate including on the plurality of trenches. The spacer material layer is then etched such that a region of a bottom surface of a trench of the plurality of trenches is exposed. A via hole is formed extending from the region of the bottom surface of the trench into the dielectric layer, wherein a dimension of the via hole is defined by a thickness of the spacer material layer.

What is claimed is:

1. A method of semiconductor fabrication, comprising:
   providing a substrate having a plurality of trenches disposed in a dielectric layer formed above the substrate;
   forming a spacer material layer on sidewalls, top surface, and bottom of each of the plurality of trenches;
   defining a via pattern in a layer disposed above the plurality of trenches and spacer material layer disposed on the sidewalls, top surface and bottom of each of the plurality of trenches;
   etching the spacer material layer from a bottom of a first trench of the plurality of trenches using the via pattern in the layer as a masking element during the etching the spacer material layer; and
   etching a via hole in the dielectric layer using the etched spacer material layer as a masking element.

2. The method of claim 1, further comprising:
   removing the layer having the via pattern defined after etching the spacer material layer.

3. The method of claim 2, further comprising:
   forming another layer having another via pattern after etching the spacer material layer.

4. The method of claim 3, further comprising:
   performing a second etching of the spacer material layer using the another via pattern.

5. The method of claim 1, wherein the etching the spacer material layer includes maintaining the spacer material layer on a bottom of at least one other trench of the plurality of trenches.

6. The method of claim 1, further comprising:
   filling the via hole with a conductive material.

7. The method of claim 1, wherein the forming the spacer material layer includes forming a conformal layer of dielectric material, wherein the conformal layer is not etched prior to forming the via pattern.

8. A method, comprising:
   forming a dielectric layer over a semiconductor substrate;
   etching a plurality of trenches in the dielectric layer, wherein the plurality of trenches define a routing for a plurality of interconnect lines;
   depositing a spacer material layer over the semiconductor substrate lining the plurality of trenches;
   after depositing the spacer material layer, depositing a patterning layer over the plurality of trenches and spacer material layer;
   defining a first opening in the patterning layer, wherein the first opening exposes a first trench of the plurality of trenches while the patterning layer is overlying a second trench of the plurality of trenches; and
   etching a first portion of the spacer material layer from a bottom surface of the first trench through the first opening, while using the patterning layer as a masking element to maintain a second portion of the spacer material layer on a bottom surface of the second trench during the etching.

9. The method of claim 8, wherein the depositing the spacer material layer is performed by an atomic layer deposition (ALD) process.

10. The method of claim 8, wherein the depositing the spacer material layer is performed to a first thickness, and the patterning layer is formed over the spacer material layer having the first thickness on the bottom surface of the first and second trenches.

11. The method of claim 8, further comprising:
    removing the patterning layer and forming another patterning layer;
    defining a second opening in the another patterning layer, wherein the second opening exposes a second trench of the plurality of trenches; and
    etching a second portion of the spacer material layer from a bottom surface of the second trench simultaneously with etching the first portion.

12. The method of claim 8, further comprising:
    etching a via hole in the dielectric layer in a region defined by the etched first portion of the spacer material layer.

13. The method of claim 12, further comprising:
    forming a first hard mask layer and a second hard mask layer over the dielectric layer, wherein the plurality of trenches extend through the first and second hard mask layers.

14. The method of claim 8, further comprising:
    etching a via hole in the dielectric layer in a region defined by the etched first portion of the spacer material layer, wherein the etching the via hole creates a via connected to and underlying the first trench.

15. The method of claim 14, further comprising:
    using a deposition process, providing a conductive material in the first trench and the via.

16. A method of semiconductor fabrication, comprising:
    providing a substrate having a plurality of trenches disposed in a dielectric layer formed above the substrate;
    forming a conformal layer over the plurality of trenches, wherein the conformal layer includes one of titanium oxide and titanium nitride;
    define a via pattern in a patterning layer disposed above the plurality of trenches and conformal layer;
    etching the conformal layer using the via pattern in the patterning layer; and
    thereafter, etching the dielectric layer using the etched conformal layer as a masking element.

17. The method of claim 16, wherein the conformal layer is deposited using atomic layer deposition.

18. The method of claim 16, further comprising:
    after the etching the dielectric layer, removing the etched conformal layer from the substrate.

19. The method of claim 18, wherein the removing is performed by a hydrogen peroxide ($H_2O_2$) etch.

20. The method of claim 16, wherein during the etching the dielectric layer the etched conformal layer is disposed on sidewalls of each of the plurality of trenches.

* * * * *